(12) United States Patent
Ogihara et al.

(10) Patent No.: US 8,859,189 B2
(45) Date of Patent: *Oct. 14, 2014

(54) PATTERNING PROCESS

(75) Inventors: Tsutomu Ogihara, Jyoetsu (JP); Takafumi Ueda, Jyoetsu (JP); Toshiharu Yano, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 52 days.

This patent is subject to a terminal disclaimer.

(21) Appl. No.: 13/430,319

(22) Filed: Mar. 26, 2012

(65) Prior Publication Data

US 2012/0276483 A1 Nov. 1, 2012

(30) Foreign Application Priority Data

Apr. 28, 2011 (JP) ................. 2011-101841

(51) Int. Cl.
*G03F 7/26* (2006.01)
*G03F 7/075* (2006.01)
*G03F 7/32* (2006.01)

(52) U.S. Cl.
CPC .............. *G03F 7/0752* (2013.01); *G03F 7/325* (2013.01)
USPC ......................................... 430/322

(58) Field of Classification Search
CPC ......... G03F 7/004; G03F 7/20; G03F 7/2041; G03F 7/11; G03F 7/32; G03F 7/322; G03F 7/40; G03F 7/0002; G03F 7/0755; H01L 21/027; H01L 21/02126; H01L 21/02214; H01L 21/02304; H01L 21/288; H01L 21/31612; H01L 21/3105; H01L 21/3162

USPC .......................................... 430/322, 324, 323
See application file for complete search history.

(56) References Cited

U.S. PATENT DOCUMENTS 4,902,603 A * 2/1990 Slater et al. ................. 430/270.1
5,178,989 A * 1/1993 Heller et al. .................. 430/323
(Continued)

FOREIGN PATENT DOCUMENTS

EP 1 845 132 A2 10/2007
EP 2 138 898 A1 12/2009
(Continued)

OTHER PUBLICATIONS

Patai, S. et al., "The Chemistry of Organic Silicon Compounds," 1989, pp. 909-916, John Wiley & Sons.

(Continued)

*Primary Examiner* — Caleen Sullivan
(74) *Attorney, Agent, or Firm* — Oliff PLC

(57) ABSTRACT

The invention provides a patterning process, comprising at least a step of forming a silicon-containing film on a body to be processed by using a composition for the silicon-containing film, a step of forming, on the silicon-containing film, a photoresist film by using a resist composition, a step of exposing to the photoresist film after heat treatment thereof, and a step of forming a negative pattern by dissolving an unexposed area of the photoresist film by using a developer of an organic solvent; wherein a composition giving the silicon-containing film whose pure-water contact angle in the part corresponding to the exposed area of the photoresist film becomes in the range of 35° or more to lower than 70° after exposure is used as the composition. There can be optimum patterning process as a patterning process of a negative resist pattern to be formed by adopting organic solvent-based development.

17 Claims, 1 Drawing Sheet

(56) References Cited

U.S. PATENT DOCUMENTS

| | | | |
|---|---|---|---|
| 5,632,910 A | 5/1997 | Nagayama et al. | |
| 2002/0187422 A1 | 12/2002 | Angelopoulos et al. | |
| 2006/0019195 A1 | 1/2006 | Hatakeyama et al. | |
| 2006/0024980 A1* | 2/2006 | Tsuchiya et al. | 438/789 |
| 2007/0178318 A1* | 8/2007 | Tanaka et al. | 428/447 |
| 2007/0238300 A1 | 10/2007 | Ogihara et al. | |
| 2009/0011366 A1 | 1/2009 | Tsubaki et al. | |
| 2009/0136869 A1 | 5/2009 | Ogihara et al. | |
| 2010/0040972 A1 | 2/2010 | Tarutani et al. | |
| 2013/0005150 A1* | 1/2013 | Ogihara et al. | 438/694 |
| 2013/0045601 A1* | 2/2013 | Ogihara et al. | 438/694 |

FOREIGN PATENT DOCUMENTS

| | | |
|---|---|---|
| EP | 2 500 775 A2 | 9/2012 |
| JP | A-7-181688 | 7/1995 |
| JP | A-7-183194 | 7/1995 |
| JP | A-2004-153125 | 5/2004 |
| JP | A-2005-128509 | 5/2005 |
| JP | A-2005-520354 | 7/2005 |
| JP | A-2007-226170 | 9/2007 |
| JP | A-2007-302873 | 11/2007 |
| JP | A-2008-281974 | 11/2008 |
| JP | A-2008-281980 | 11/2008 |
| JP | A-2009-53657 | 3/2009 |
| JP | A-2009-126940 | 6/2009 |
| TW | 2008-06746 A | 2/2008 |

OTHER PUBLICATIONS

Aug. 12, 2013 Extended European Search Report issued in European Application No. 12002878.2.

Jan. 20, 2014 Taiwanese Office Action issued in Taiwanese Patent Application No. 101115187 (with partial English-language translation).

* cited by examiner

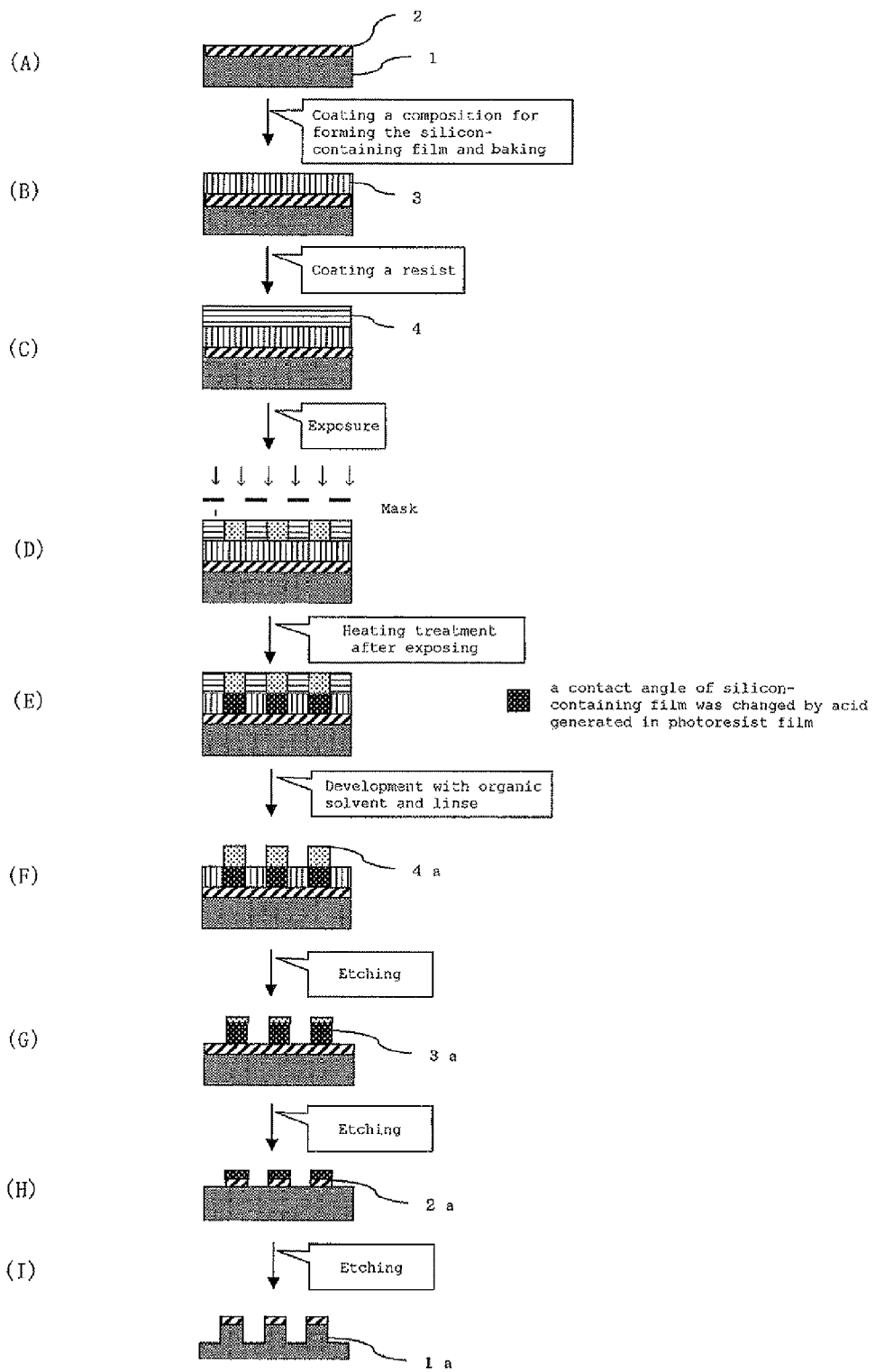

PATTERNING PROCESS

BACKGROUND OF THE INVENTION

1. Field of the Invention

The present invention relates to a patterning process including a patterning process to form a negative resist pattern by using an organic solvent developer.

2. Description of the Related Art

In recent years, as LSI progresses toward higher integration and further acceleration in speed, miniaturization of a pattern rule is required. In the light-exposure used as a general technology nowadays, resolution inherent to wavelength of a light source is approaching to its limit. In 1980s, a g-line (436 nm) or an i-line (365 nm) of a mercury lamp was used as an exposure light to be used in a resist pattern forming. As a mean for further miniaturization, a method of shifting to a shorter wavelength of an exposing light was assumed to be effective. As a result, in a mass production process after DRAM (Dynamic Random Access Memory) with 64-megabits (0.25 μm or less of a processing dimension) in 1990s, a KrF excimer laser (248 nm), a shorter wavelength than an i-beam (365 nm), was used in place of an i-line as an exposure light source.

However, in production of DRAM with an integration of 256 M, 1 G and higher which require further miniaturized process technologies (process dimension of 0.2 μm or less), a light source with a further short wavelength is required, and thus a photo lithography using an ArF excimer laser (193 nm) has been investigated seriously since about a decade ago. At first, an ArF lithography was planned to be applied to a device starting from a 180 nm node device, but a KrF excimer laser lithography lived long to a mass production of a 130 nm node device, and thus a full-fledged application of an ArF lithography will start from a 90 nm node. Further, a mass production of a 65 nm node device by combining with a lens having an increased NA till 0.9 is now underway.

Further shortening of wavelength of an exposure light is progressing towards the next 45 nm node device, and for that an $F_2$ lithography with a 157 nm wavelength became a candidate. However, there are many problems in an $F_2$ lithography; an increase in cost of a scanner due to the use of a large quantity of expensive $CaF_2$ single crystals for a projector lens, extremely poor sustainability of a soft pellicle, which leads to a change of an optical system due to introduction of a hard pellicle, a decrease in an etching resistance of a resist film, and the like. Because of these problems, it was proposed to postpone an $F_2$ lithography and to introduce an ArF immersion lithography earlier.

In the ArF immersion lithography, water having a refractive index of 1.44 is inserted between the projection lens and a wafer by a partial filling manner to enable high-speed scanning, thereby allowing to conduct mass-production of 45 nm node devices by a lens having an NA on the order of 1.3.

Exemplary candidates of lithography techniques for 32 nm nodes include extreme ultraviolet (EUV) lithography at a wavelength of 13.5 nm. Then, exemplary objects accompanying to the EUV lithography are to increase an output of laser, enhance a sensitivity of resist film, enhance a resolution, decrease a line edge roughness (LER), achieve a defect-free MoSi laminate mask, lower aberrations of a reflecting mirror, for example, thereby leaving a pile of objects to be attained.

Another candidate of 32 nm nodes is a high refractive index immersion lithography, the development of which has been abandoned, due to lower transmittance of LuAG as a candidate of high refractive index lens therefor, and due to failure of achievement of a refractive index of a liquid to be increased up to a targeted value of 1.8.

Attention has been again directed to organic solvent-based development recently. This is to form a negative pattern by organic solvent-based development of an adopted positive resist composition having a higher resolution, so as to resolve an extremely fine hole pattern by virtue of exposure in a negative tone, which hole pattern is not attained in a positive tone. Further progressed is an investigation to obtain a two-fold finer resolving power, by mutually combining two times of development comprising an alkaline development and the organic solvent-based development.

Usable as an ArF resist composition for development in a negative tone by an organic solvent, is a positive ArF resist composition of a conventional type, and examples of patterning processes therefor are shown in Japanese Patent Laid-Open (kokai) No. 2008-281974, Japanese Patent Laid-Open (kokai) No. 2008-281980, Japanese Patent Laid-Open (kokai) No. 2009-53657, for example.

Proposed in the patent applications according to the above-noted Patent Documents, are resist compositions for organic solvent-based development, and patterning processes therefor, respectively, where the resist compositions are obtained by: copolymerization including hydroxyadamantane methacrylate; copolymerization including norbornanelactone methacrylate; or copolymerization of a methacrylate having acidic groups such as a carboxyl group, sulfo group, phenol group, thiol group, or the like substituted by two or more kinds of acid labile groups, with a methacrylate having an ester of cyclic acid stable group.

As one method to solve such a problem, multi-layer resist process have been used. The methods are configured to: interpose an intermediate film, for example a resist underlayer film containing silicon atom, having an etching selectivity different from that of a photoresist film, i.e., a resist upper layer film, between the resist upper layer film and a processing substrate; obtain a pattern in the resist upper layer film; thereafter transfer the pattern to the resist underlayer film by dry etching by using the obtained resist upper layer film pattern as a dry etching mask; and further transfer the pattern onto the processing substrate by dry etching by using the obtained pattern of the underlayer film as a dry etching mask.

Examples of silicon-containing resist underlayer films to be used in the above-described multi-layer resist process include silicon-containing inorganic films by CVD, such as $SiO_2$ films (Japanese Patent Laid-Open (kokai) No. H7-183194, for example) and SiON films (Japanese Patent Laid-Open (kokai) No. H7-181688, for example); and films obtained by spin coating, such as SOG (spin-on-glass) films (Japanese Patent Laid-Open (kokai) No. 2007-302873, for example), and crosslinkable silsesquioxane films (Japanese translation of PCT international application No. 2005-520354, for example).

SUMMARY OF THE INVENTION

However, in the patterning process of a negative resist using an organic solvent developer as mentioned above, on contrary to a positive development (alkaline development) in which a resist pattern comprising a hydrophobic compound not soluble in an alkaline developer is formed, in a negative development (organic solvent development), a resist pattern comprising a hydrophilic compound having an acidic group such as a carboxyl group formed by a deprotection reaction in high concentration is formed; and thus, in a patterning process using such conventional materials as those used for an underlayer film of the alkaline development, there has been a possibility that performance of a photoresist of an upper layer may not be fully expressed.

The present invention has been carried out in view of the above circumstances, and it is therefore an object of the present invention to provide a patterning process, which is optimum as a patterning process of a negative resist pattern to be formed by adopting organic solvent-based development.

In order to solve the foregoing problems, the present invention provides a patterning process, comprising at least a step of forming a silicon-containing film on a body to be processed by using a composition for the silicon-containing film, a step of forming, on the silicon-containing film, a photoresist film by using a resist composition of a chemical amplification type, a step of exposing a high energy beam to the photoresist film after heat treatment thereof, and a step of forming a negative pattern by dissolving an unexposed area of the photoresist film by using a developer of an organic solvent; wherein a composition giving the silicon-containing film whose pure-water contact angle in the part corresponding to the exposed area of the photoresist film becomes in the range of 35 degrees or more to lower than 70 degrees after exposure is used as the composition for the silicon-containing film.

In the patterning process as mentioned above, adhesion between the negative pattern after development and the silicon-containing film is improved so that a pattern collapse may not take place even in a narrow line pattern; and thus, this is the best method as the patterning process for the negative resist formed by using an organic solvent developer.

Further, as the composition for the silicon-containing film, it is possible to use a composition containing at least a silicon-containing compound (A) having a repeating unit shown by the following general formula (A-1);

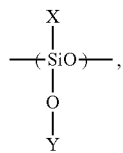
(A-1)

wherein

X represents an oxygen-containing functional group shown by any of the following general formulae (A-1-1), (A-1-2), and (A-1-3); and Y represents a hydrogen atom, or any of an alkyl group, an alkoxy alkyl group, and a trialkyl silyl group, with the carbon atoms contained in these alkyl groups being 1 to 6, or a repeating unit shown by the following general formula (A-1-4) or (A-1-5);

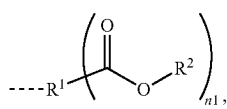
(A-1-1)

wherein n1 represents 1 or 2; $R^1$ represents a single bond or a linear, a branched, or a cyclic saturated or unsaturated hydrocarbon group having 1 to 20 carbon atoms; and $R^2$ represents a hydrogen atom, or a linear, a branched, or a cyclic saturated or unsaturated hydrocarbon group having 1 to 10 carbon atoms, wherein $R^1$ and $R^2$ may contain one or more kinds selected from an oxygen atom, a silicon atom, and a halogen atom, while the dotted line therein shows the bonding site to the silicon atom;

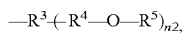
(A-1-2)

wherein n2 represent 1 or 2; each $R^3$ and $R^4$ independently represents a single bond, or a linear, a branched, or a cyclic saturated or unsaturated hydrocarbon group having 1 to 20 carbon atoms, though they do not represent a single bond simultaneously; $R^5$ represents a hydrogen atom, or a linear, a branched, or a cyclic saturated or unsaturated hydrocarbon group having 1 to 10 carbon atoms, or an acyl group, wherein $R^3$, $R^4$, and $R^5$ may contain one or more kinds selected from an oxygen atom, a silicon atom, and a halogen atom, while the dotted line therein shows the bonding site to the silicon atom;

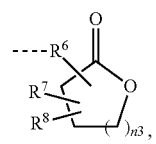
(A-1-3)

wherein n3 represent 0, 1, or 2; and each $R^6$, $R^7$, and $R^8$ independently represents a saturated or unsaturated organic group having 1 to 20 carbon atoms and may contain any of an oxygen atom, a silicon atom, and a halogen atom, wherein $R^6$, $R^7$, and $R^8$ may form a cyclic organic group by bonding any two or more of them, while the dotted line therein shows the bonding site to the silicon atom;

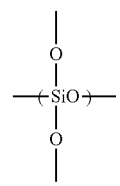
(A-1-4)

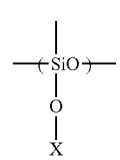
(A-1-5)

wherein X represents the same meaning as before.

If the silicon-containing film is formed by using the composition as mentioned above, the pure-water contact angle of the present invention in the silicon-containing film after exposure can be obtained; and thus, a patterning process having good adhesion in a resist pattern after development and a lower degree of roughness can be provided.

Moreover, as the composition for the silicon-containing film, it is possible to use a composition containing a silicon-containing compound (A') whose repeating unit shown by the general formula (A-1) is changed to any of repeating units shown by the following general formulae (A-2), (A-3a), and (A-3b) by action of an acid generated by exposure in the photoresist film;

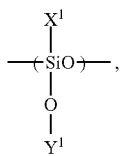
(A-2)

wherein

X¹ represents an oxygen-containing functional group shown by the following general formula (A-2-1) or (A-2-2); and Y¹ represents a hydrogen atom, or any of an alkyl group, an alkoxy alkyl group, and a trialkyl silyl group, with the carbon atoms contained in these alkyl groups being 1 to 6, or a repeating unit shown by the general formula (A-1-4) or (A-1-5), or by the following general formula (A-2-3);

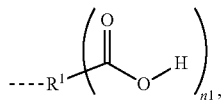
(A-2-1)

wherein n1 and $R^2$ represent the same meanings as before, while the dotted line therein shows the bonding site to the silicon atom;

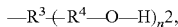
(A-2-2)

wherein n2, $R^3$, and $R^4$ represent the same meanings as before, while the dotted line therein shows the bonding site to the silicon atom;

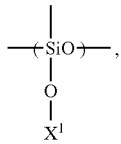
(A-2-3)

wherein $X^2$ represents the same meaning as before;

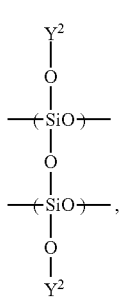
(A-3a)

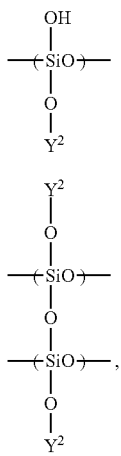
(A-3b)

wherein $Y^2$ represents a hydrogen atom, or any of an alkyl group, an alkoxy alkyl group, and a trialkyl silyl group, with the carbon atoms contained in these alkyl groups being 1 to 6, or a repeating unit shown by the general formula (A-1-4), (A-1-5), or (A-2-3), or by the following general formula (A-3a-1) or (A-3b-1);

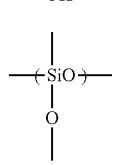
(A-3a-1)

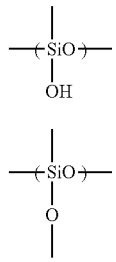
(A-3b-1)

When the repeating unit shown by the general formula (A-1) is changed to any of repeating units shown by the general formulae (A-2), (A-3a), and (A-3b) by action of an acid generated by exposure in the photoresist film, a hydrogen bonding with a resist pattern after development is formed thereby leading to further improvement in adhesion; and thus, when a composition containing the silicon-containing compound like this (A') is used, a patterning process not causing a pattern collapse even in a pattern of a narrower line may be provided.

Further, it is preferable that a composition containing the silicon-containing compound (A') showing a lower pure-water contact angle of the silicon-containing film obtained therefrom after exposure than the pure-water contact angle thereof before exposure is used as the composition for the silicon-containing film.

In the step to form a negative pattern, an acid-labile group in the exposed area of the photoresist is removed by an acid generated from a photo acid generator thereby changing to a polymer structure containing a carboxyl group or a phenolic group, the both being hydrophilic; and as a result, the contact angle is decreased as compared with the photoresist film before the exposure. When a composition containing the silicon-containing compound (A'), showing a lower pure-water contact angle of the silicon-containing film obtained therefrom after exposure than the pure-water contact angle thereof before exposure, is used as the composition for the silicon-containing film so that, similarly to the photoresist film, the contact angle of the silicon-containing film after exposure may be decreased as compared to the contact angle before exposure (during coating and baking), the contact angle thereof after exposure can coincide with the contact angle of the pattern while keeping uniformity in film thickness during photoresist coating; and as a result, a pattern without a pattern collapse can be formed because an adhesion can be further improved.

Moreover, the patterning process of the photoresist film can be effected by any of a photolithography with the wavelength ranging from 10 nm or more to 300 nm or less, a direct drawing by an electron beam, and a nanoimprinting, or a combination of them.

In case of adopting the patterning process of the present invention, when forming a negative pattern by patterning the resist upper layer in this way, a negative pattern can be formed with the same performance as a conventional positive pattern.

Further, the developer can contains, as a developer component, one or more solvents selected from 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl pentanoate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In this case, it is preferable that the developer containing one, or two or more of the developer components with the total amount thereof being 50% or more by mass is used.

In the step of forming negative pattern in patterning process of the present invention, using the developer containing such components enables to form a line pattern without pattern collapse, and a hole pattern excellent in circularity.

Further, it is possible that after an organic underlayer film or an organic hard mask is formed on the body to be processed, the silicon-containing film is formed on the organic underlayer film or on the organic hard mask.

Moreover, it is possible that after the negative pattern is formed, pattern transfer to the silicon-containing film is done by dry etching using the photoresist film having the formed pattern as a mask, pattern transfer to the organic underlayer film or the organic hard mask is done by dry etching using the silicon-containing film having the transferred pattern as a mask, and pattern transfer further to the body to be processed is done by dry etching using the organic underlayer film or the organic hard mask having the transferred pattern as a mask.

When the patterning process of the present invention is used, a pattern formed in photoresist of the upper layer can be formed on the substrate without causing size difference by optimizing a combination of an organic underlayer film formed by application, an organic hard mask formed by a CVD method, and so on, as mentioned above.

Moreover, as the body to be processed, it is possible to use a semiconductor substrate having any of a metal film, a metal carbide film, a metal oxide film, a metal nitride film, and a metal oxy nitride film formed thereon.

In this case, it is preferable that the metal to constitute the body to be processed is any of silicon, titanium, tungsten, hafnium, zirconium, chromium, germanium, copper, aluminum, and iron, or an alloy of them.

Using the patterning process of the present invention enables to form a pattern, by processing a body to be processed as noted above.

As explained above, according to the patterning process of the present invention, a formed negative photoresist pattern has an excellent adhesion; and thus, a pattern without a pattern collapse and with a lower degree of surface roughness can be formed. In addition, the formed photoresist pattern can be transferred by a dry etching process to a silicon-containing resist underlayer film, and then to an organic underlayer film or to a CVD carbon film in order. Especially in the pattern obtained by the negative development, the photoresist film becomes thin because an acid-labile group is removed; and thus, pattern transcription to a conventional silicon-containing underlayer film is difficult. However, when the patterning process of the present invention is used, even if the photoresist that is made thin by the negative development is used as an etching mask, deformation of the photoresist pattern during dry etching can be suppressed so that this pattern may be transferred to a substrate with high precision.

BRIEF DESCRIPTION OF THE DRAWINGS

FIG. 1 is an explanatory view showing one embodiment of a patterning process according to the present invention.

DESCRIPTION OF THE PREFERRED EMBODIMENTS

Hereinafter, the present invention will be explained.

As mentioned above, a patterning process using an organic solvent development has been receiving attention again in recent years. However, in the patterning process of a negative resist using an organic solvent developer as mentioned above, on contrary to a positive development (alkaline development) in which a resist pattern comprising a hydrophobic compound not soluble in an alkaline developer is formed, in a negative development (organic solvent development), a resist pattern comprising a hydrophilic compound having an acidic group such as a carboxyl group formed by a deprotection reaction in high concentration is formed; and thus, in a patterning process using such conventional materials as those used for an underlayer film of the alkaline development, there has been a possibility that performance of a photoresist of an upper layer may not be fully expressed.

It has been known from the study by inventors of the present invention that, in a conventional positive development (alkaline development) of a positive photoresist, components of a photoresist at the time of application (film property of a forming coat film before exposure) are almost the same as the components remained as a pattern after exposure (film property of a forming pattern after exposure); and thus, by coinciding the pure-water contact angle (herein after referred to as contact angle) during the time of forming a resist underlayer film just about with the contact angle of the photoresist, adhesion of a pattern can be improved so that a pattern collapse can be avoided and the roughness thereof can be effectively reduced.

However, it became clear from an extensive study by inventors of the present invention that, in the negative pattern obtained in a negative development using an organic solvent, when comparison on film property is made between the photoresist coat film before exposure and the pattern formed after exposure, amount of a hydrophilic group such as a carboxyl group and a phenolic hydroxy group is increased because a protective group is removed in the pattern after exposure by action of an acid generated by the exposure, and therefore the contact angle of the resist pattern is shifted toward a more hydrophilic side as compared with immediately after formation of the film, namely shifted toward a lower side; and as a result, in a resist underlayer film for a conventional positive type whose contact angle is coincided with that of the photoresist film before exposure, discrepancy with the contact angle of the negative pattern is generated thereby affecting pattern collapse and roughness thereof.

Based on this, a further study has been carried out, and as a result, it was found that, in the patterning process of a negative pattern, the contact angle of the resist underlayer film immediately before the development by using an organic solvent is more important than the time of film formation by coating and baking; namely, when the resist underlayer film having an appropriate contact angle at the time of the organic solvent development is used, namely when the resist underlayer film having the contact angle coincided with a film property of the negative pattern is used, a resist pattern obtained by the organic solvent development is excellent in reproducibility and adhesion without causing a pattern collapse even in a narrow line pattern, and in addition, the pattern is excellent in resistance to the organic solvent used as the developer and in pattern roughness. The present invention was accomplished by this finding.

A patterning process of the present invention comprises at least a step of forming a silicon-containing film on a body to be processed by using a composition for the silicon-containing film, a step of forming, on the silicon-containing film, a photoresist film by using a resist composition of a chemical amplification type, a step of exposing a high energy beam to the photoresist film after heat treatment thereof, and a step of forming a negative pattern by dissolving an unexposed area of the photoresist film by using a developer of an organic solvent; wherein a composition giving the silicon-containing film whose pure-water contact angle in the part corresponding to the exposed area of the photoresist film becomes in the range of 35 degrees or more to lower than 70 degrees after exposure is used as the composition for the silicon-containing film.

As the composition for the silicon-containing film used in the present invention, a composition containing at least a silicon-containing compound (A) having a repeating unit shown by the following general formula (A-1) can be used;

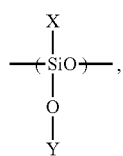
(A-1)

wherein

X represents an oxygen-containing functional group shown by any of the following general formulae (A-1-1), (A-1-2), and (A-1-3); and Y represents a hydrogen atom, or any of an alkyl group, an alkoxy alkyl group, and a trialkyl silyl group, with the carbon atoms contained in these alkyl groups being 1 to 6, or a repeating unit shown by the following general formula (A-1-4) or (A-1-5);

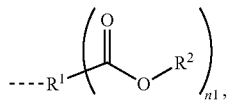
(A-1-1)

wherein n1 represents 1 or 2; $R^1$ represents a single bond or a linear, a branched, or a cyclic saturated or unsaturated hydrocarbon group having 1 to 20 carbon atoms; and $R^2$ represents a hydrogen atom, or a linear, a branched, or a cyclic saturated or unsaturated hydrocarbon group having 1 to 10 carbon atoms, wherein $R^1$ and $R^2$ may contain one or more kinds selected from an oxygen atom, a silicon atom, and a halogen atom, while the dotted line therein shows the bonding site to the silicon atom;

$$—R^3—(R^4—O—R^5)_{n2}—, \quad (A\text{-}1\text{-}2)$$

wherein n2 represent 1 or 2; each $R^3$ and $R^4$ independently represents a single bond, or a linear, a branched, or a cyclic saturated or unsaturated hydrocarbon group having 1 to 20 carbon atoms, though they do not represent a single bond simultaneously; $R^5$ represents a hydrogen atom, or a linear, a branched, or a cyclic saturated or unsaturated hydrocarbon group having 1 to 10 carbon atoms, or an acyl group, wherein $R^3$, $R^4$, and $R^5$ may contain one or more kinds selected from an oxygen atom, a silicon atom, and a halogen atom, while the dotted line therein shows the bonding site to the silicon atom;

(A-1-3)

wherein n3 represent 0, 1, or 2; and each $R^6$, $R^7$, and $R^8$ independently represents a saturated or unsaturated organic group having 1 to 20 carbon atoms and may contain any of an oxygen atom, a silicon atom, and a halogen atom, wherein $R^6$, $R^7$, and $R^8$ may form a cyclic organic group by bonding any two or more of them, while the dotted line therein shows the bonding site to the silicon atom;

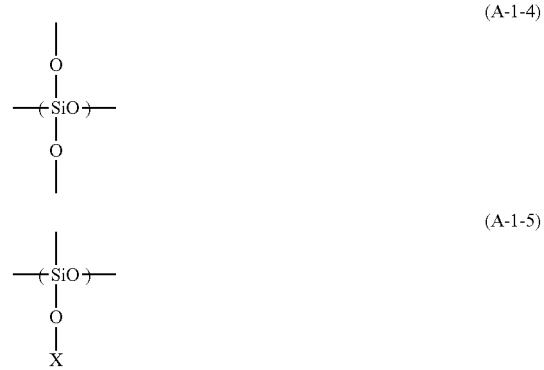
(A-1-4)

(A-1-5)

wherein X represents the same meaning as before.

Examples of the structure represented by the above general formula (A-1-1) are shown below.

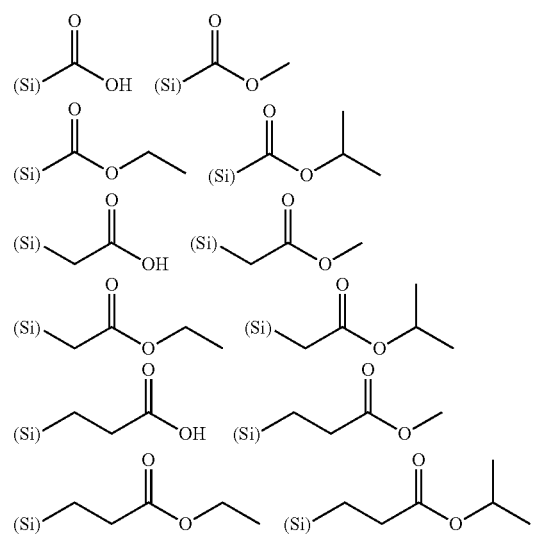

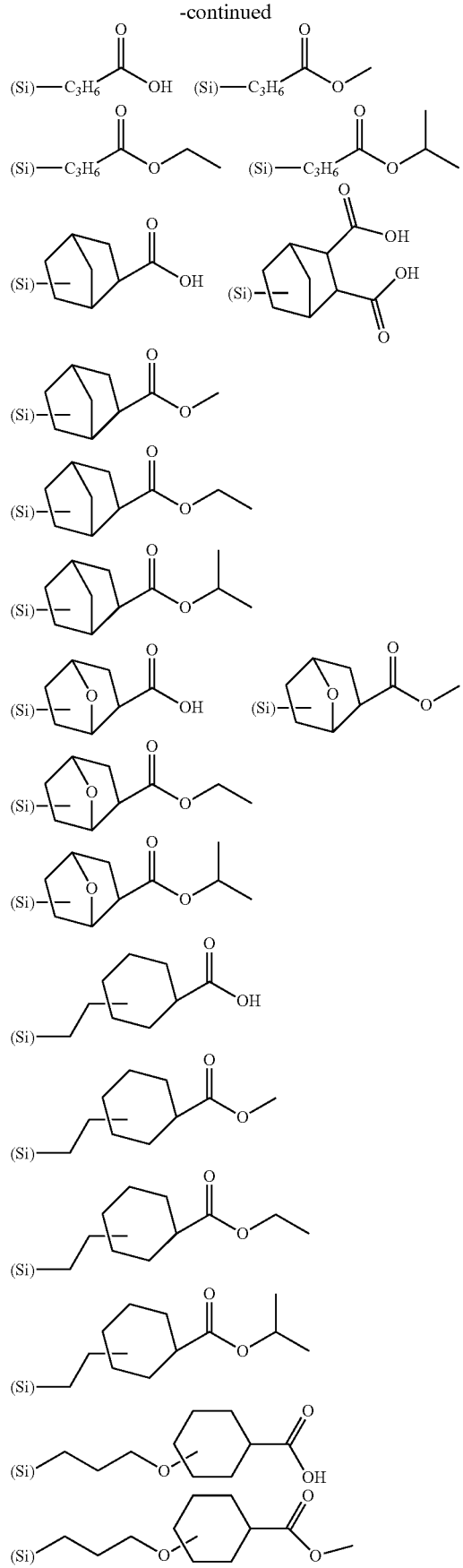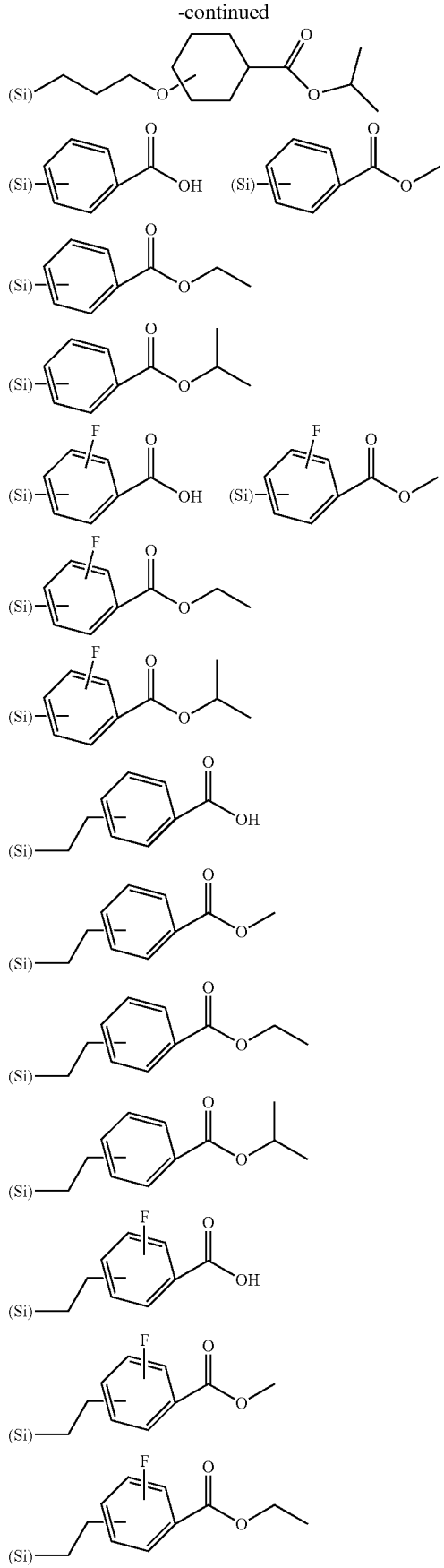

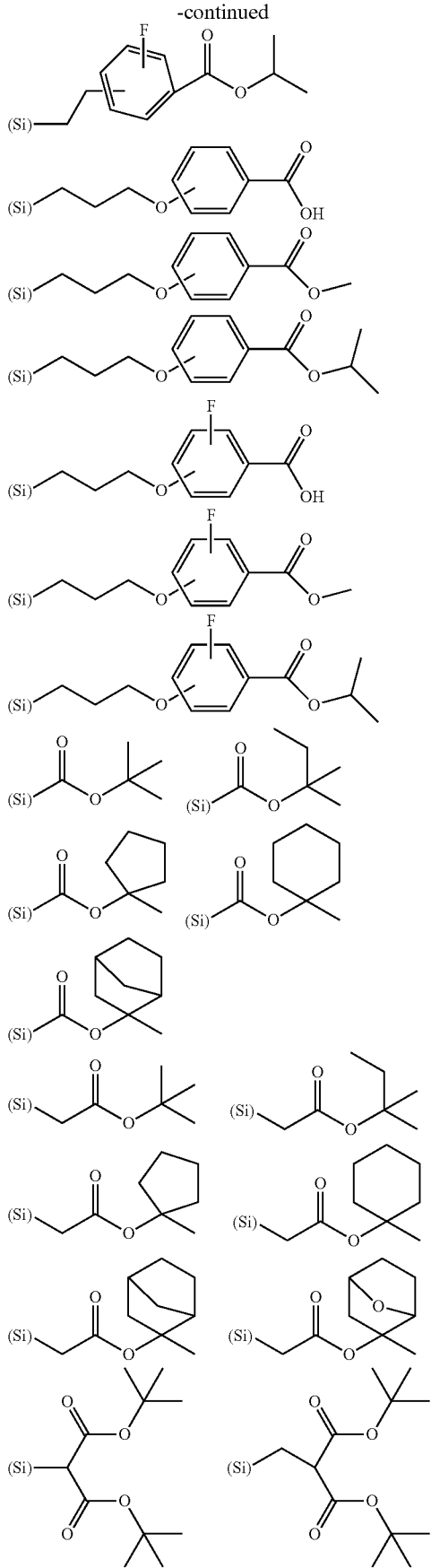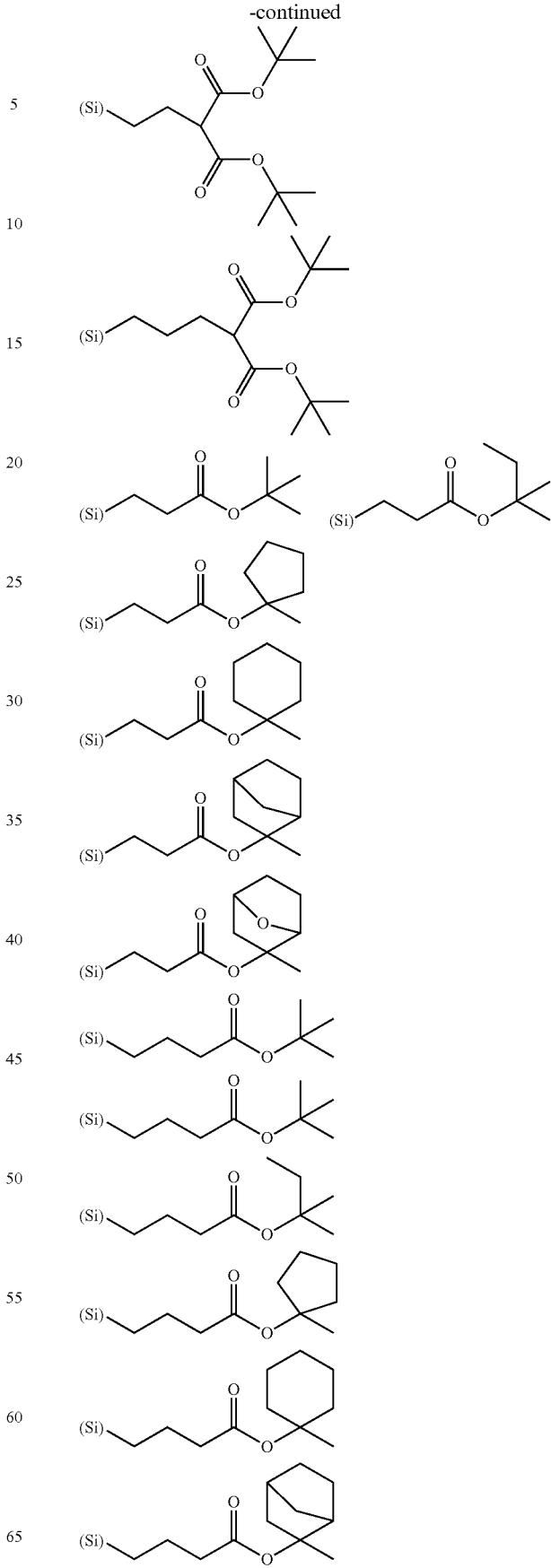

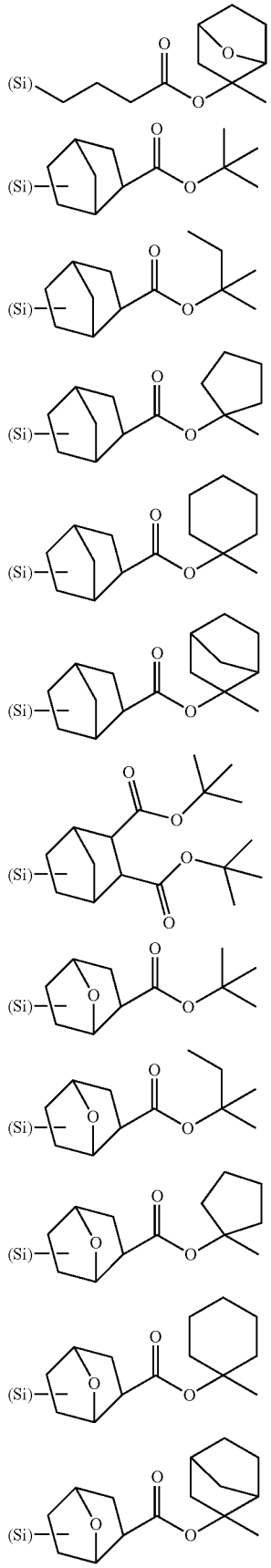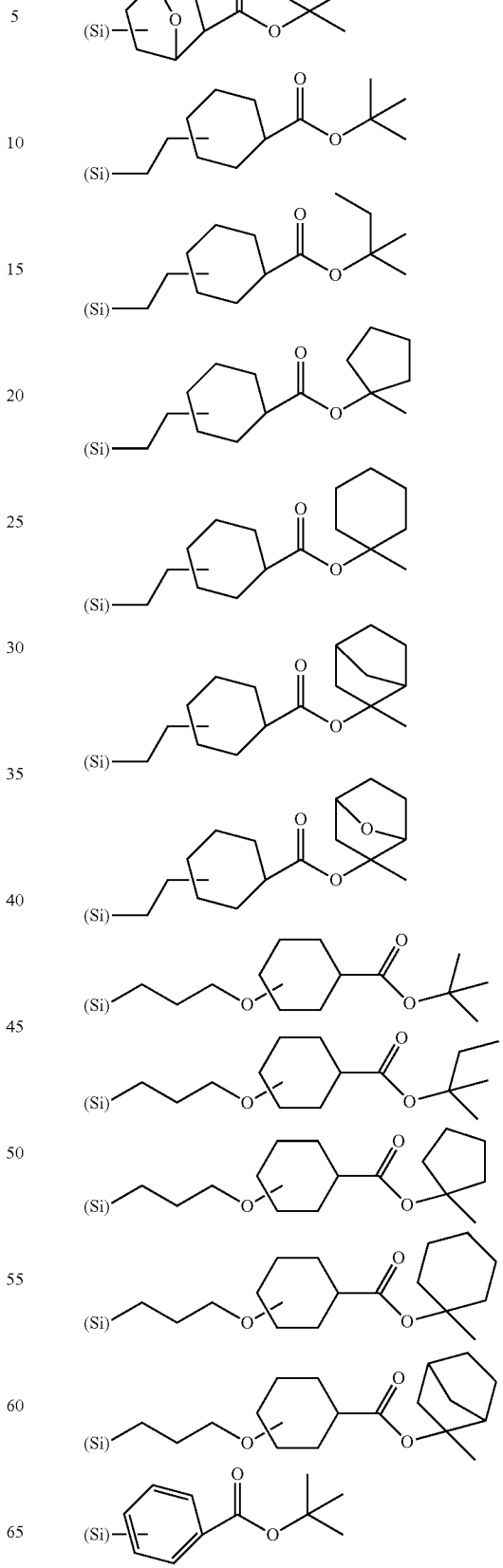

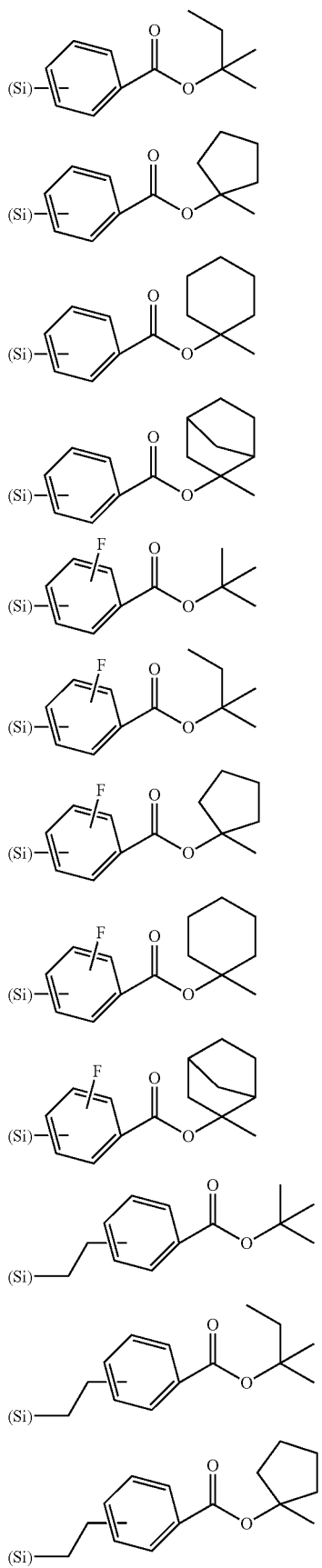
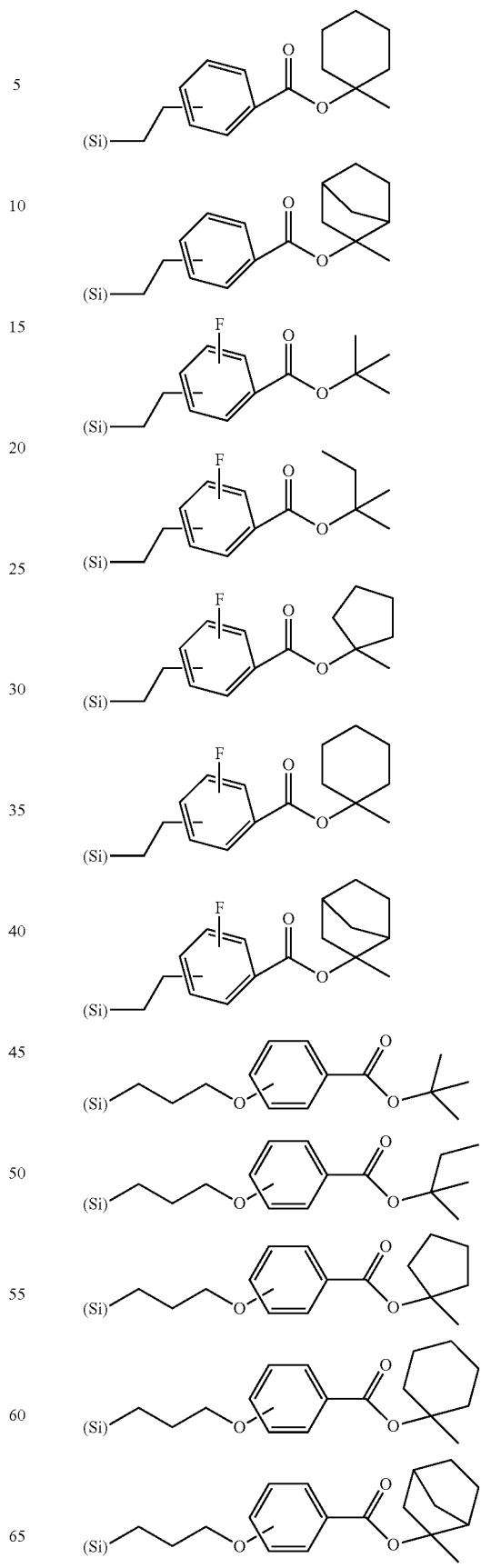

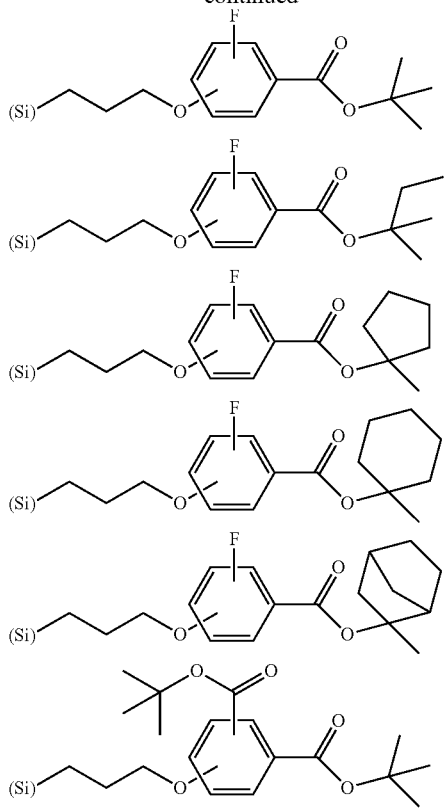
Examples of the structure represented by the above general formula (A-1-2) are shown below.
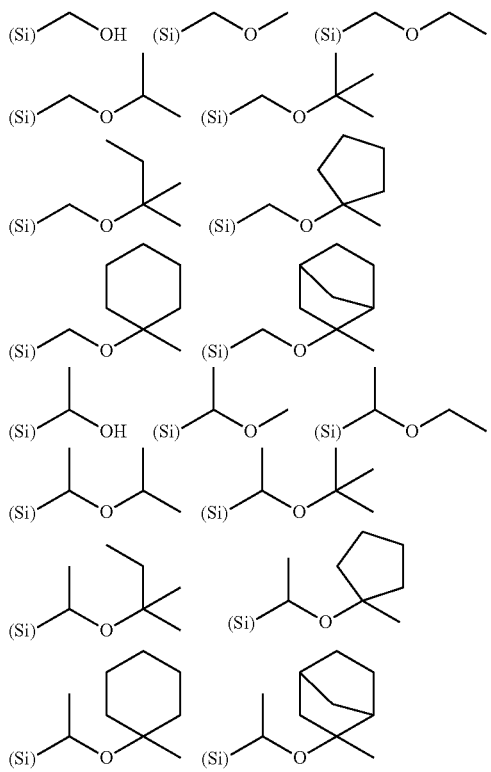
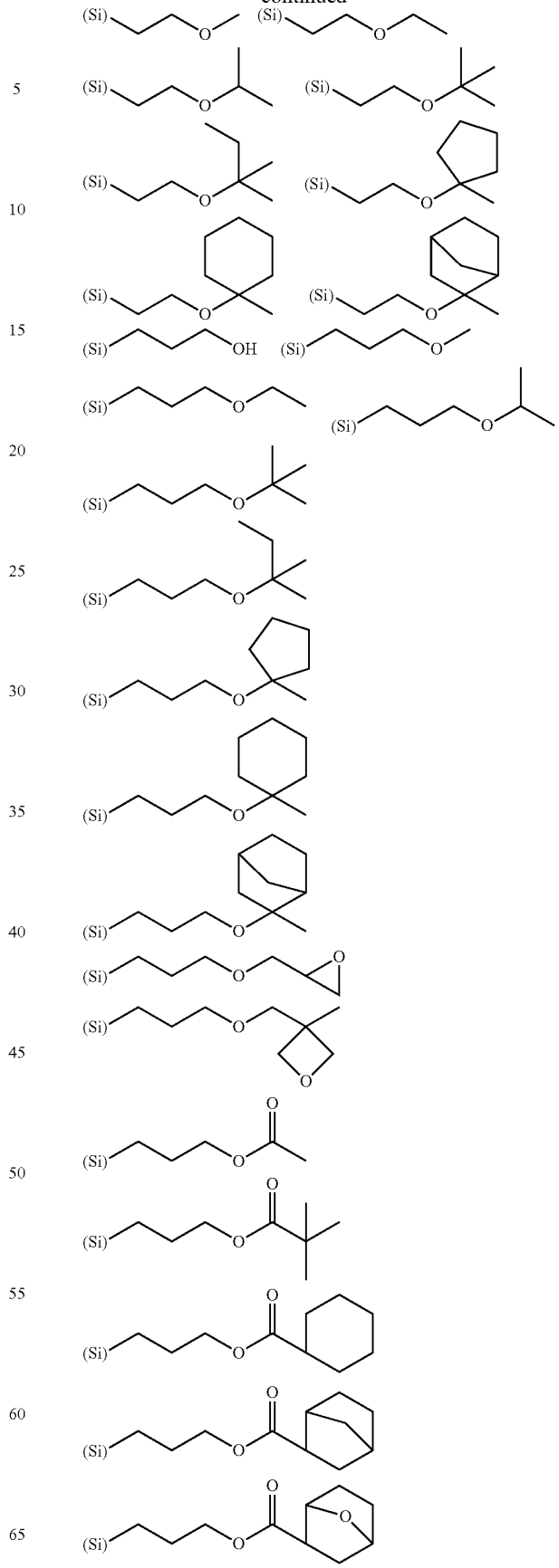

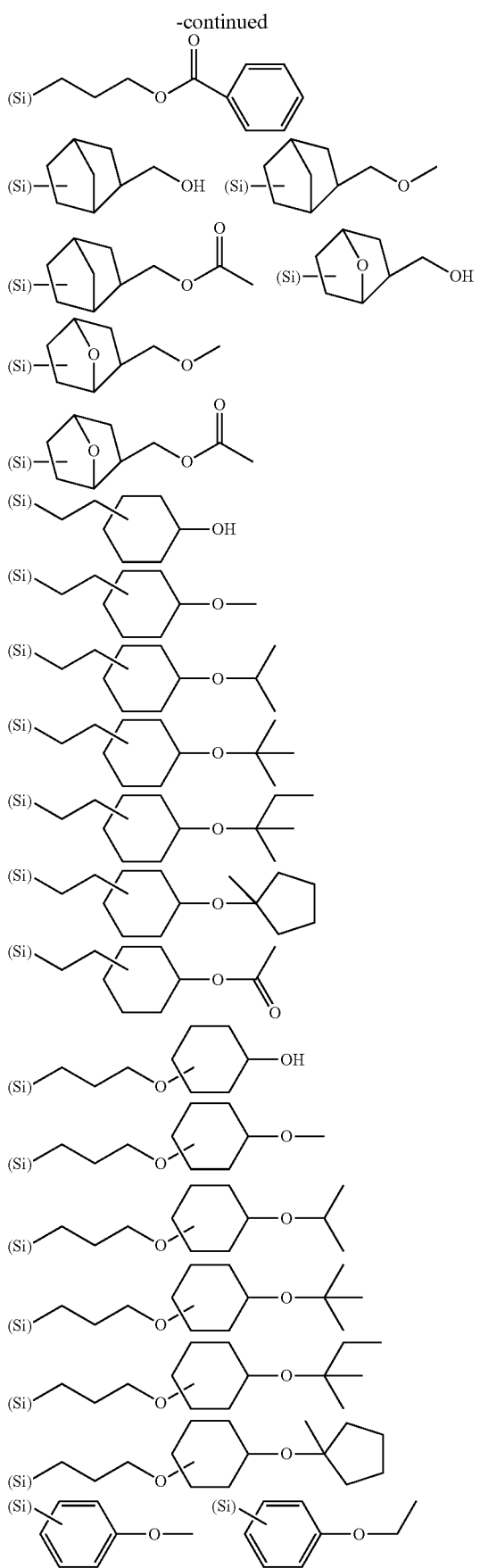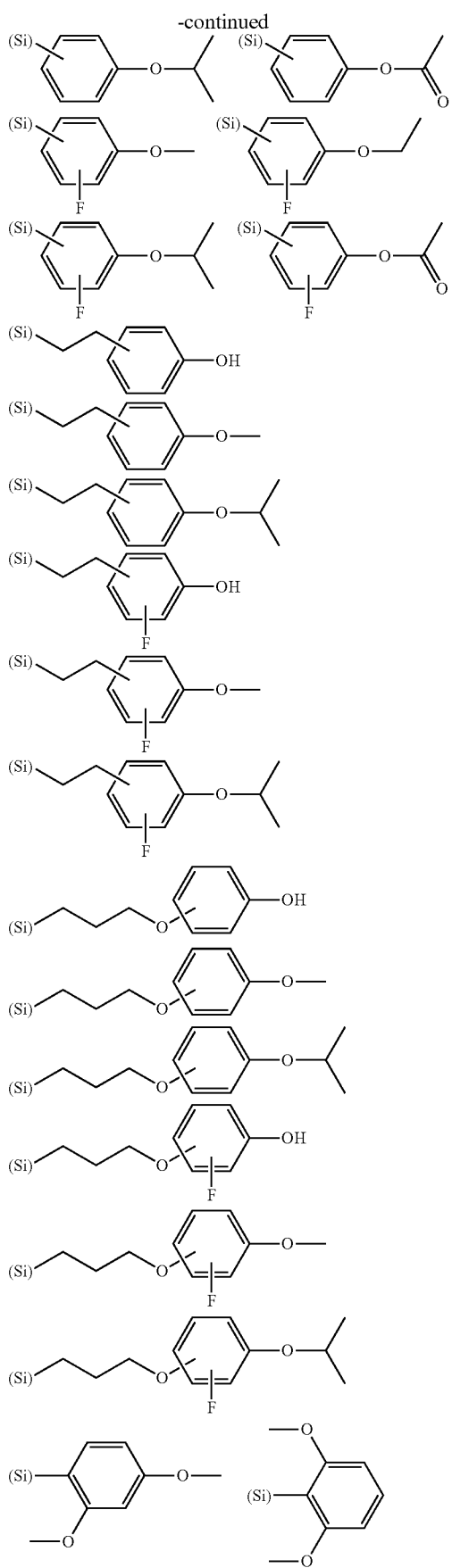

-continued
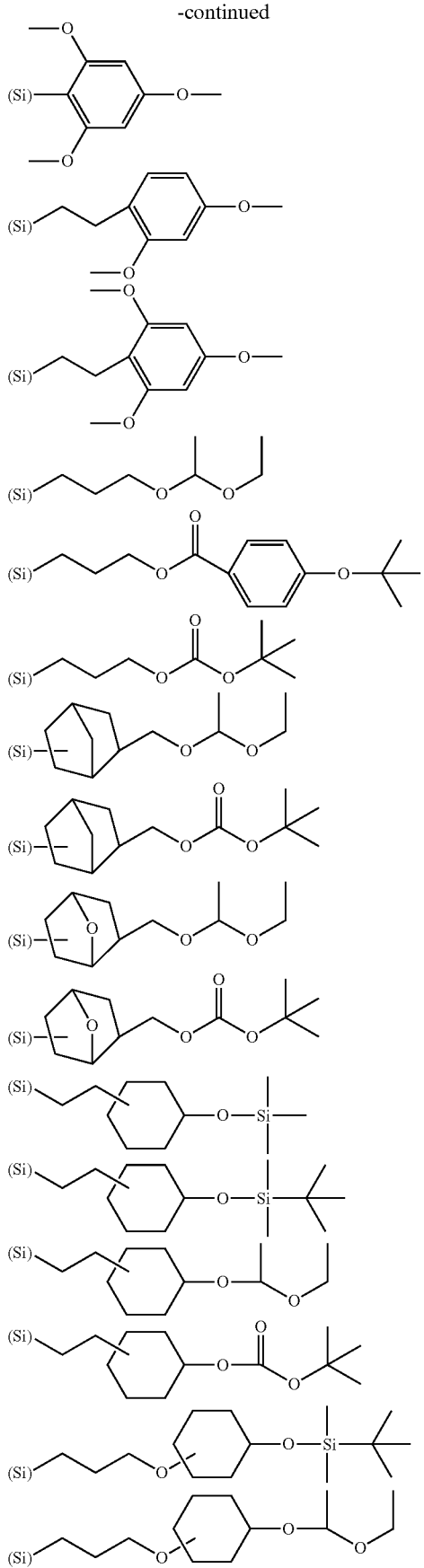
-continued
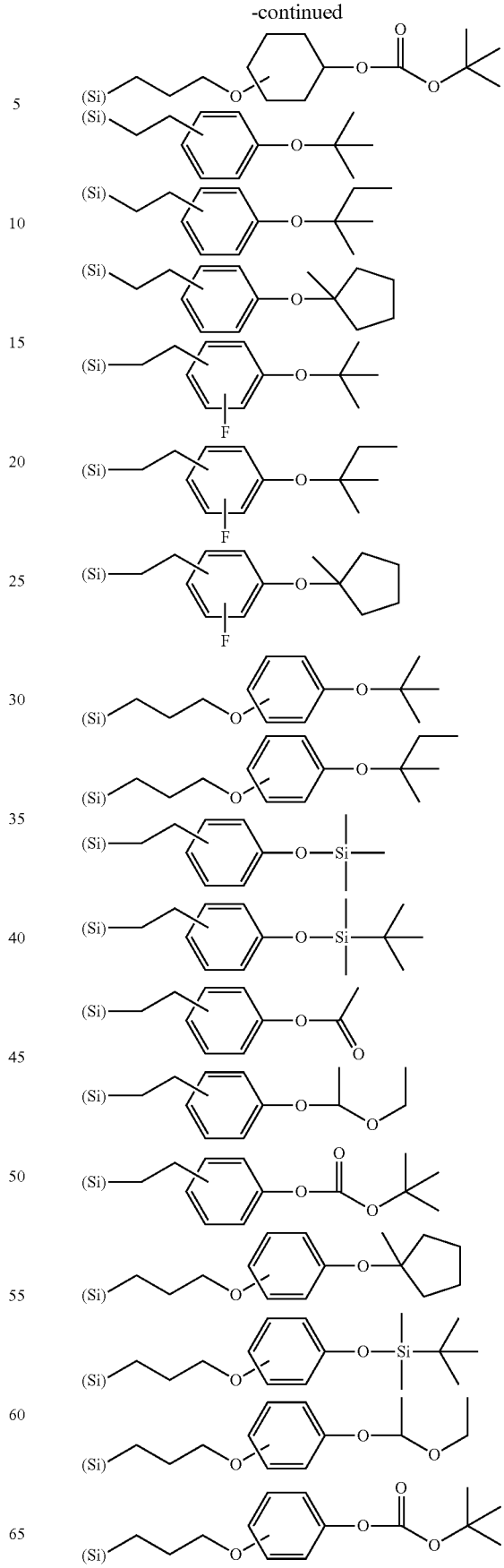

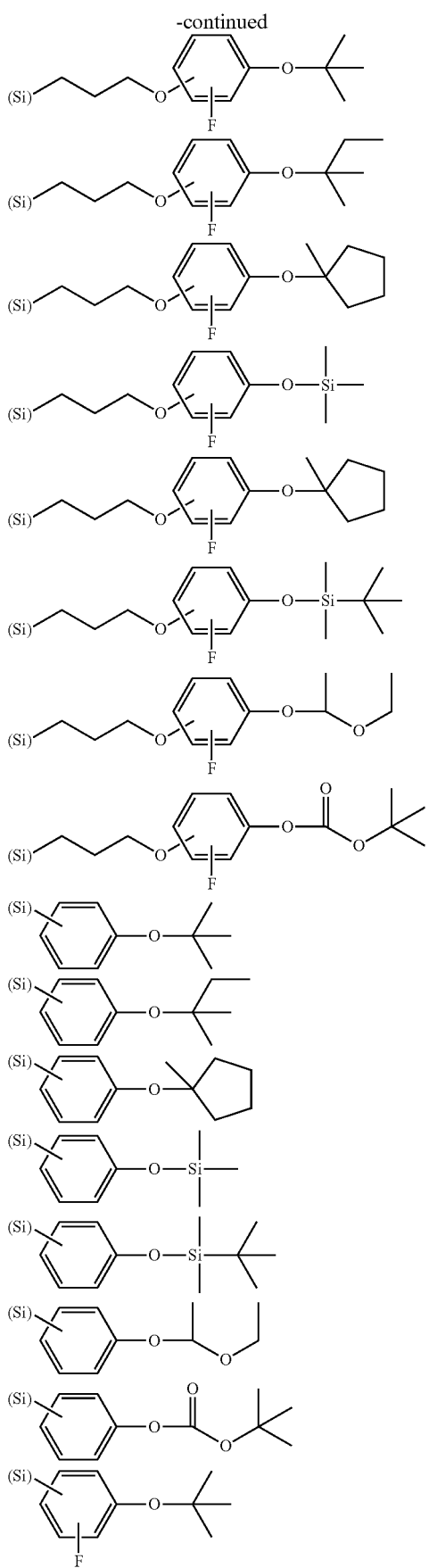
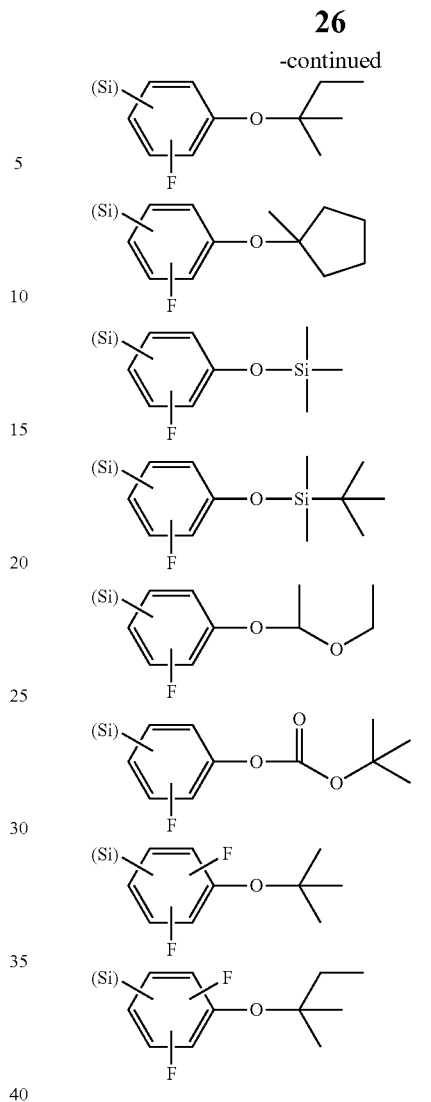
Examples of the structure represented by the above general formula (A-1-3) are shown below.
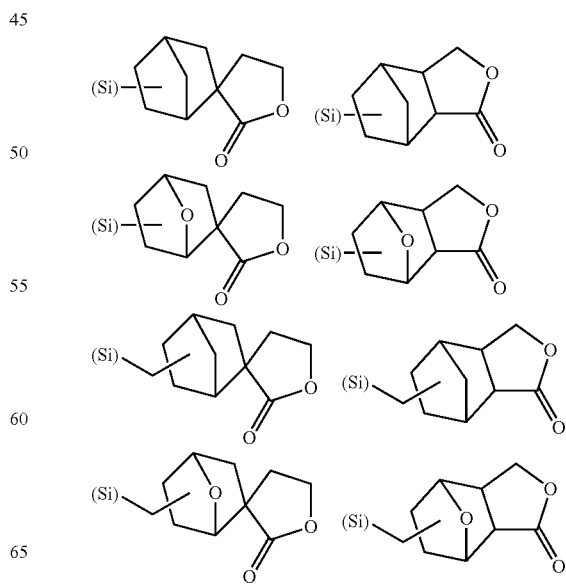

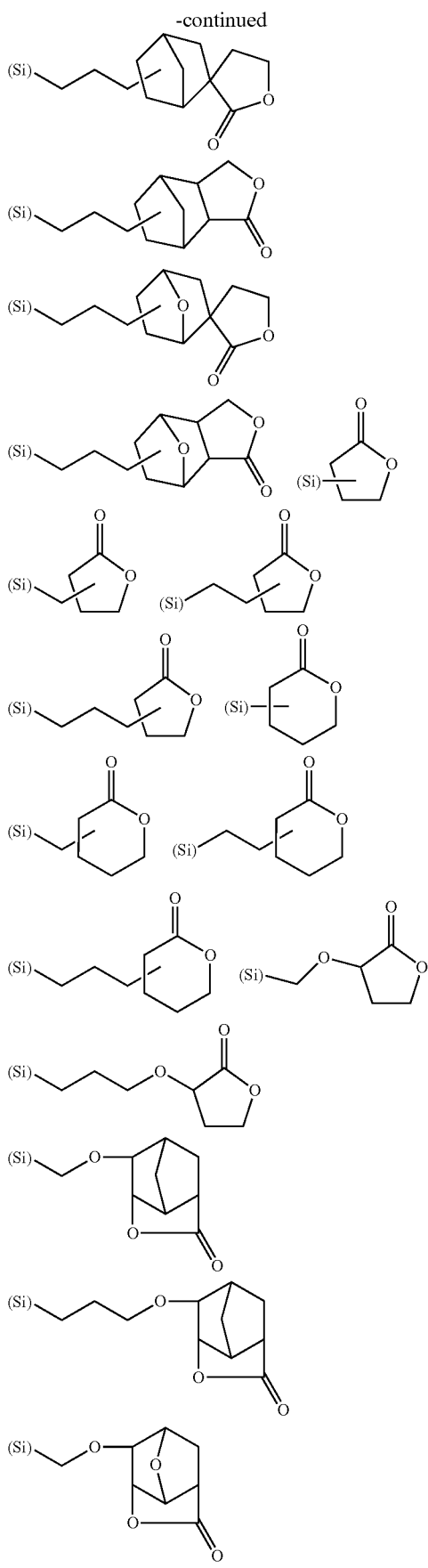

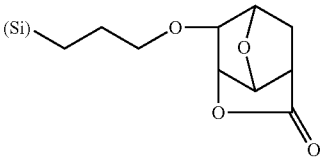

Meanwhile, as to the monomer (A-1-0) giving a repeating unit shown by the general formula (A-1), a monomer having two or three hydrolysable groups selected from a methoxy group, an ethoxy group, a propoxy group, a butoxy group, and so on which are bonded to a silicon atom to which the groups shown as the specific examples of the general formulae (A-1-1) to (A-1-3) is bonded may be used (this silicon atom is shown by (Si) in above structural formulae).

In the patterning process of the present invention, as the composition for forming a silicon-containing film that becomes an underlayer film of the photoresist, if a composition giving the silicon-containing film whose pure-water contact angle in the part corresponding to the exposed area of the photoresist film becomes in the range of 35 degrees or more to lower than 70 degrees after exposure is used, effects to give an excellent pattern and so on may be expected even with a negative development (organic solvent development).

Further, if the pure-water contact angle of the silicon-containing film after exposure is made lower than the pure-water contact angle thereof before exposure, especially during the time of forming the silicon-containing film, the contact angle thereof is made similar to the contact angle of the photoresist before exposure (70 to 80 degrees), while after exposure the contact angle is made similar to the contact angle of the formed negative pattern (about 50 to 60 degrees of the contact angle), adhesion can be maintained during the time of applying a photoresist on the silicon-containing film as well as during the time of forming the resist pattern.

Accordingly, as the composition for forming the silicon-containing film, it is preferable to use a composition containing a silicon-containing compound (A') whose repeating unit shown by the general formula (A-1) is changed, by action of an acid generated by photo exposure in the photoresist film, to any of repeating units shown by the following general formulae, (A-2), (A-3a), and (A-3b), namely, to a more hydrophilic functional group such as a silanol group by elimination of a part of the organic functional group contained therein;

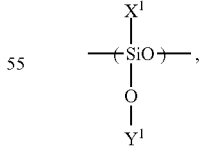

(A-2)

wherein $X^1$ represents an oxygen-containing functional group shown by the following general formula (A-2-1) or (A-2-2). $Y^1$ represents a hydrogen atom, or any of an alkyl group, an alkoxy alkyl group, and a trialkyl silyl group, with the carbon atoms contained in these alkyl groups being 1 to 6, or a repeating unit shown by the general formula (A-1-4) or (A-1-5), or by the following general formula (A-2-3);

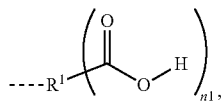 (A-2-1)

wherein n1 and $R^1$ represent the same meanings as before, while the dotted line therein shows the bonding site to the silicon atom;

 (A-2-2)

wherein n2, $R^3$, and $R^4$ represent the same meanings as before, while the dotted line therein shows the bonding site to silicon atom;

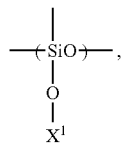 (A-2-3)

wherein $X^1$ represents the same meaning as before;

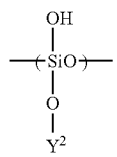 (A-3a)

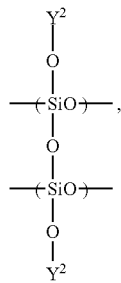 (A-3b)

wherein $Y^2$ represents a hydrogen atom, or any of an alkyl group, an alkoxy alkyl group, and a trialkyl silyl group, with the carbon atoms contained in these alkyl groups being 1 to 6, or a repeating unit shown by the general formula (A-1-4), (A-1-5), or (A-2-3), or by the following general formula (A-3a-1) or (A-3b-1).

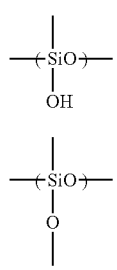 (A-3a-1)

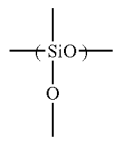 (A-3b-1)

As the specific examples of the general formulae (A-2-1) and (A-2-2), among the specifically mentioned structures shown by (A-1-1) to (A-1-3), those having an OH group at the terminal end thereof may be mentioned.

If the silicon-containing film is formed by using the composition as mentioned above, the contact angle of the silicon-containing film is approximately in the range of 70 to 80 degrees because a substituent group is bonded to a carboxyl group or a hydroxy group during the time of forming the silicon-containing film. Therefore, the contact angle thereof is similar to the contact angle of the photoresist during the time of application of the photoresist; and thus, ununiformity during application, which is considered to be one of possible causes of the defects, can be avoided. Then, a hydrophilic carboxylic acid group or a hydrophilic hydroxy group are formed on surface of the silicon-containing film by action of an acid, generated in the photoresist during the time of exposure, to an acid-labile group present on surface of the silicon-containing film so that the contact angle of the silicon-containing film after exposure may coincide with the contact angle of the photoresist pattern for the negative development. With this measure, the contact angle of the negatively-developed resist pattern roughly coincides with the contact angle of the silicon-containing film, thereby avoiding the resist pattern collapse.

On the other hand, it is not desirable if the contact angle is less than 35 degrees, because the discrepancy with the contact angle of the photoresist is too large.

As to the compound (monomer) having an acid-labile group to form the silicon compound (A') like this, a tertiary alkyl ester compound, a tertiary alkyl phenyl ether compound, an acetal compound, and the like are preferable among the afore-mentioned monomers (A-1-0).

For example, among the tertiary alkyl phenyl ether compounds, it is known that, in the case that a phenyl group and a silicon atom are directly bonded and a tertiary alkyl ether group is located in a proper position to the silicon atom, especially when the tertiary alkyl group is eliminated thereby changing to a hydroxyphenyl group by action of an acid generated during the time of exposure in the presence of a proper electrophilic agent as an additive, a Si—C bond is cleaved at the Si-ipso position on the benzene ring to form a silanol group (Non-Patent Document: Saul Patai and Zvi Rappoport, "The chemistry of organic silicon compounds", John Wiley & Sons, 909-916 (1989)).

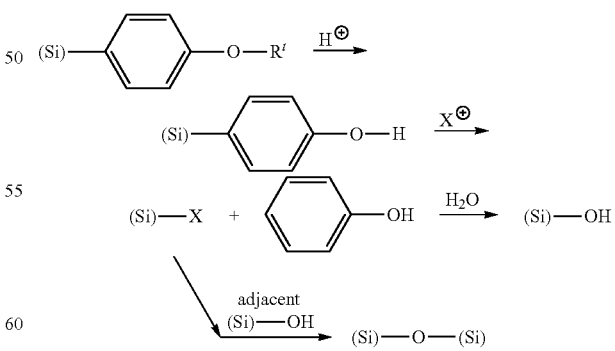

In the present invention, if this reaction is utilized, a silicon-containing film can be formed by using a composition containing a tertiary alkyl phenyl ether; the composition having relatively low hydrophilicity before the reaction and resembling the structure of the resist composition before the exposure. In addition, after the exposure, a silanol group having high hydrophilicity, namely having a low contact angle, and good adhesion with a negatively-developed resist pattern is formed; and as a result, fall of a negatively-developed resist pattern can be avoided.

Such compound, a tertiary alkyl phenyl ether-containing compound is especially preferable.

Further, the silicon-containing compound (A), in the composition for forming silicon-containing film used in the patterning process of the present invention can contain hydrolysable monomers represented by following general formulae (A-3), (A-4-1) and (A-4-2).

$$(R^{12})_{m12}(OR^{13})_{(3-m12)}Si-R^{11}-Si(R^{14})_{m14}(OR^{15})_{(3-m14)} \quad (A\text{-}3)$$

$$R^{21}{}_{m21}R^{22}{}_{m22}R^{23}{}_{m23}Si(OR^{24})_{(4-m21-m22-m23)} \quad (A\text{-}4\text{-}1)$$

$$U(OR^{31})_{m31}(OR^{32})_{m32}(O)_{m33/2}, \quad (A\text{-}4\text{-}2)$$

wherein
$R^{11}$ represents a single bond, or a divalent organic group having 1 to 20 carbon atoms,
each $R^{12}$ and $R^{14}$ independently represents a hydrogen atom, or a monovalent organic group having 1 to 20 carbon atoms, each $R^{22}$ and $R^{14}$ may be the same or different,
each $R^{13}$ and $R^{15}$ independently represents a hydrogen atom, or an alkyl group having 1 to 6 carbon atoms, and
m12 and m14 represent integers satisfying that $0 \le m12+m14 \le 2$;
each $R^{21}$, $R^{22}$, and $R^{23}$ may be the same or different, and independently represents a hydrogen atom, or a monovalent organic group having 1 to 30 carbon atoms,
each m21, m22, and m23 independently represents 0 or 1, and satisfy that $0 \le m21+m22+m23 \le 3$, and
$R^{24}$ represents a hydrogen atom, or an alkyl group having 1 to 6 carbon atoms; and
each $R^{31}$ and $R^{32}$ independently represent a hydrogen atom, or an organic group having 1 to 30 carbon atoms,
m31+m32+m33/2 represents a valence to be determined by a kind of U,
each m31, m32, and m33 independently represents an integer of 0 or more, and
U represents one of elements belonging to the III group, IV group, and V group in the periodic table, except for carbon and silicon.

Examples of the compound represented by the general formula (A-3) are shown below.

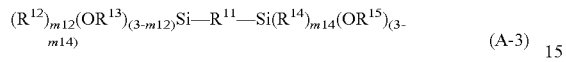
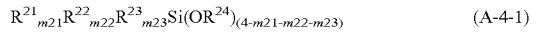
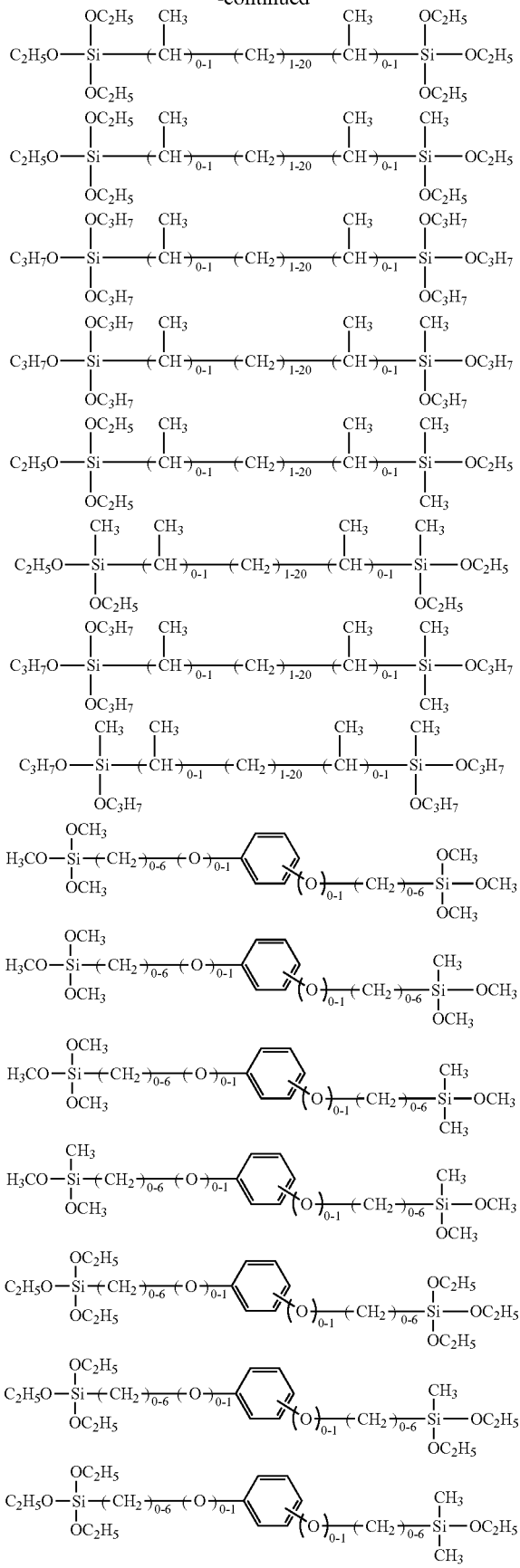

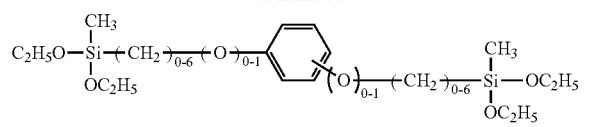
Especially preferable examples are shown below.
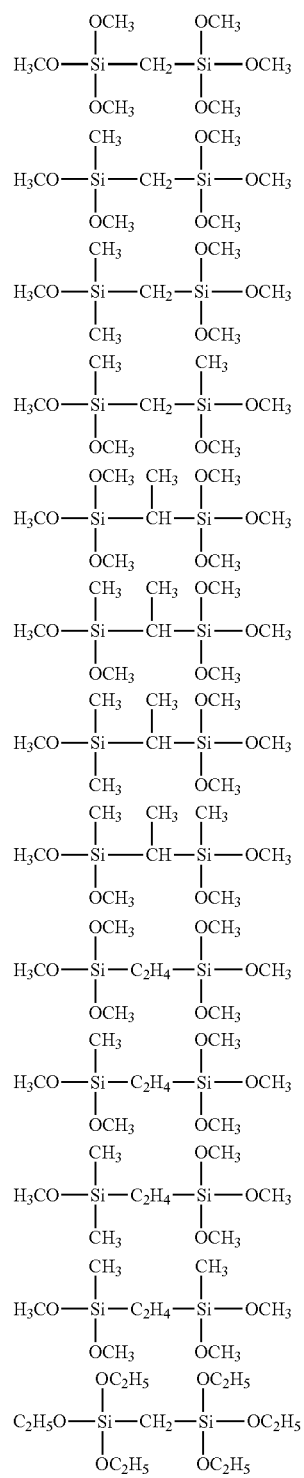
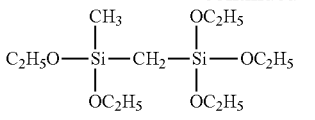
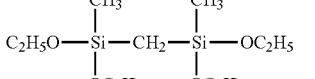
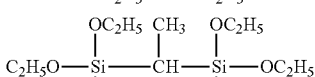
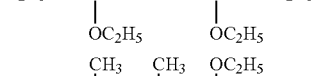
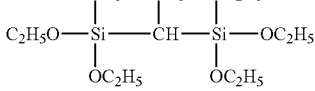
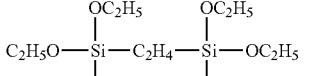
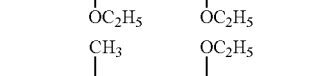
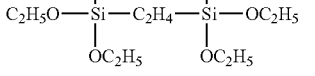
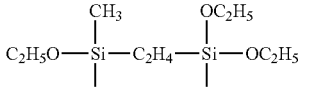
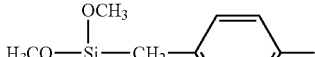
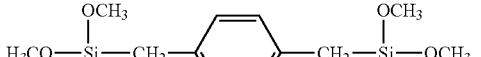
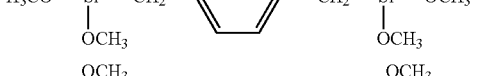
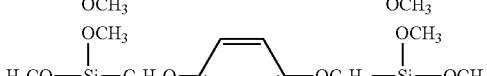
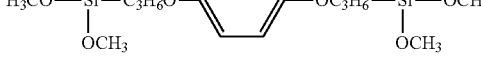

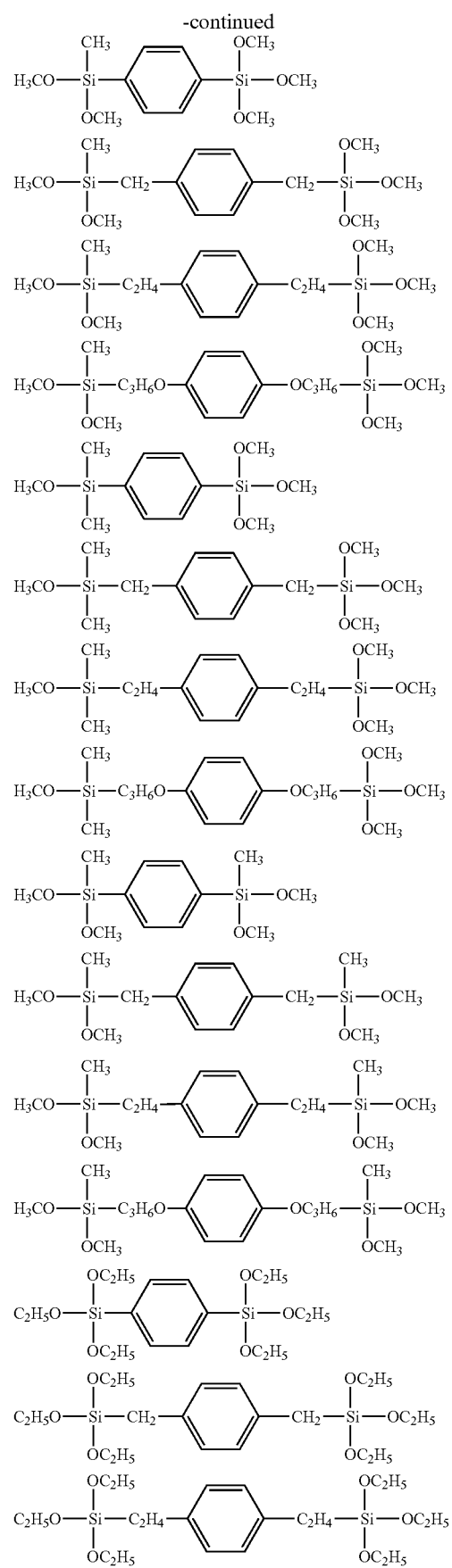
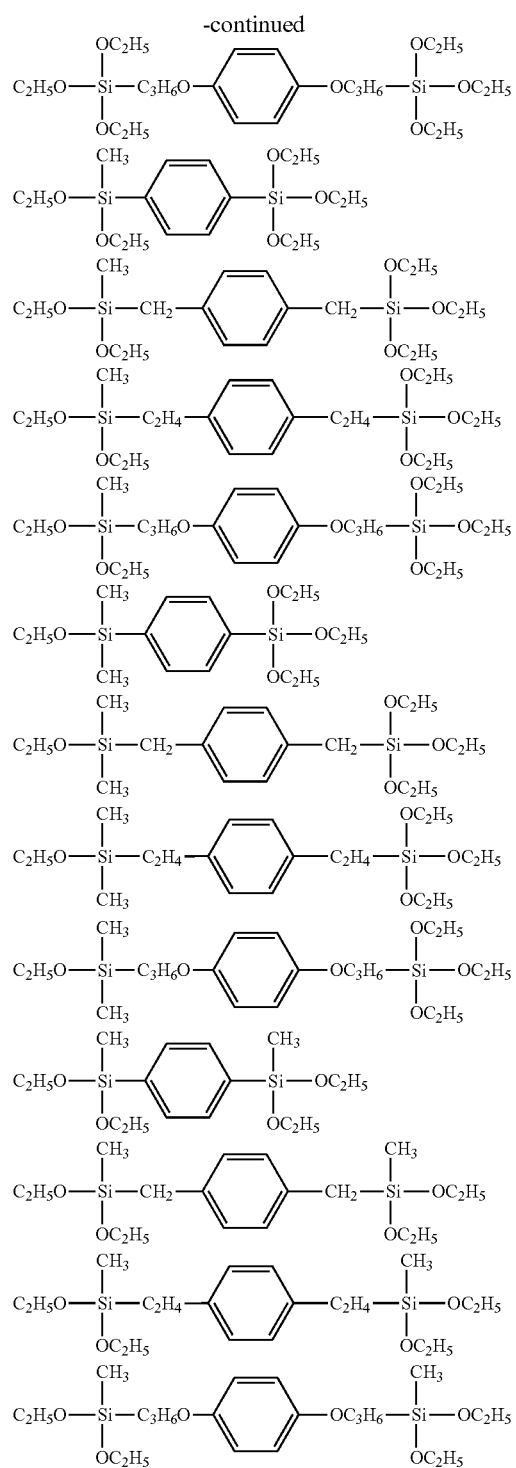

The compounds represented by the general formula (A-4-1) may be shown below.

Examples of tetraalkoxysilanes which satisfy m21+m22+m23=0 include tetramethoxysilane, tetraethoxysilane, tetrapropoxysilane, and tetraisopropoxysilane and the like.

Examples of trialkoxysilanes which satisfy m21+m22+m23=1 include trimethoxysilane, triethoxysilane, tripropoxysilane, tri isopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, tolyltrimethoxysilane, tolyltriethoxysilane, tolyltripropoxysilane, tolyltriisopropoxysilane, anisyltrimethoxysilane, anisyltriethoxysilane, anisyltripropoxysilane, anisyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, and naphthyltriisopropoxysilane.

Examples of dialkoxysilanes which satisfy m21+m22+m23=2 include dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bisbicycloheptenyldimethoxysilane, bisbicycloheptenyldiethoxysilane, bisbicycloheptenyldipropoxysilane, bisbicycloheptenyldiisopropoxysilane, bisbicycloheptyldimethoxysilane, bisbicycloheptyldiethoxysilane, bisbicycloheptyldipropoxysilane, bisbicycloheptyldiisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, and diphenyldiisopropoxysilane.

Examples of monoalkoxysilanes which satisfy m21+m22+m23=3 include trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Preferable examples among them include tetramethoxysilane, tetraethoxysilane methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, toryltrimethoxysilane, toryltriethoxysilane, anisyltrimethoxysilane, anisyltriethoxysilane, dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, and dimethylphenethylmethoxysilane.

The compounds represented by the general formula (A-4-2) may be shown below, but the compounds are not restricted to these compounds.

When U is boron, examples of the compounds represented by the formula (A-4-2) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, and boric acid, boron oxide.

When U is aluminum, examples of the compounds represented by the formula (A-4-2) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl-acetoacetate, aluminum dibutoxyethyl-acetoacetate, aluminum propoxy-bis-ethyl-acetoacetate, aluminum butoxy-bis-ethyl-acetoacetate, aluminum 2,4-pentanedionate, and aluminum 2,2,6,6-tetramethyl-3,5-heptanedionate.

When U is gallium, examples of the compounds represented by the formula (A-4-2) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl-acetoacetate, gallium dibutoxyethyl-acetoacetate, gallium propoxy-bis-ethyl-acetoacetate, gallium butoxy-bis-ethyl-acetoacetate, gallium 2,4-pentanedionate, and gallium 2,2,6,6-tetramethyl-3,5-heptanedionate.

When U is yttrium, examples of the compounds represented by the formula (A-4-2) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl-acetoacetate, yttrium dibutoxyethyl-acetoacetate, yttrium propoxy-bis-ethyl-acetoacetate, yttrium butoxy-bis-ethyl-acetoacetate, yttrium 2,4-pentanedionate, and yttrium 2,2,6,6-tetramethyl-3,5-heptanedionate.

When U is germanium, examples of the compounds represented by the formula (A-4-2) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When U is titanium, examples of the compounds represented by the formula (A-4-2) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy-bisethyl-acetoacetate, titanium dibutoxy-bisethyl-acetoacetate, titanium dipropoxy-bis-2,4-pentanedionate, and titanium dibutoxy-bis-2,4-pentanedionate.

When U is hafnium, examples of the compounds represented by the formula (A-4-2) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy-bisethyl-acetoacetate, hafnium dibutoxy-bisethyl-acetoacetate, hafnium dipropoxy-bis-2,4-pentanedionate, and hafnium dibutoxy-bis-2,4-pentanedionate.

When U is tin, examples of the compounds represented by the formula (A-4-2) include, as monomers, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

When U is arsenic, examples of the compounds represented by the formula (A-4-2) include, as monomers, methoxy arsenic, ethoxy arsenic, propoxy arsenic, butoxy arsenic, and phenoxy arsenic.

When U is antimony, examples of the compounds represented by the formula (A-4-2) include, as monomers, methoxy antimony, ethoxy antimony, propoxy antimony, butoxy antimony, phenoxy antimony, antimony acetate, and antimony propionate.

When U is niobium, examples of the compounds represented by the formula (A-4-2) include, as monomers, methoxy niobium, ethoxy niobium, propoxy niobium, butoxy niobium, and phenoxy niobium.

When U is tantalum, examples of the compounds represented by the formula (A-4-2) include, as monomers, methoxy tantalum, ethoxy tantalum, propoxy tantalum, butoxy tantalum, and phenoxy tantalum.

When U is bismuth, examples of the compounds represented by the formula (A-4-2) include, as monomers, methoxy bismuth, ethoxy bismuth, propoxy bismuth, butoxy bismuth, and phenoxy bismuth.

When U is phosphorus, examples of the compounds represented by the formula (A-4-2) include, as monomers, trimethyl phosphite, triethyl phosphite, tripropyl phosphite, trimethyl phosphate, triethyl phosphate, tripropyl phosphate, and diphosphorus pentoxide.

When U is vanadium, examples of the compounds represented by the formula (A-4-2) include, as monomers, vanadium oxide-bis(2,4-pentanedionate), vanadium 2,4-pentanedionate, vanadium tributoxide oxide, and vanadium tripropoxide oxide.

When U is zirconium, examples of the compounds represented by the formula (A-4-2) include, as monomers, methoxy zirconium, ethoxy zirconium, propoxy zirconium, butoxy zirconium, phenoxy zirconium, zirconium dibutoxide-bis(2,4-pentanedionate), and zirconium dipropoxide-bis(2,2,6,6-tetramethyl-3,5-heptanedionate).

As to the silicon-containing compound (A) contained in the composition for the silicon-containing film to be used for the present invention, a mixture prepared by mixing, prior to the reaction or during the reaction, one or more foregoing monomers (A-1-0), and as appropriate, one or more compounds selected from the group consisting of the general formulae (A-3), (A-4-1), and (A-4-2), may be used as a raw material for the reaction to form the silicon-containing compound (A).

As the manufacturing methods of the silicon-containing compound (A), following methods may be mentioned, though not limited to them.

The silicon-containing compound (A) can be produced, by conducting hydrolytic condensation between the above reaction starting material (hereinafter referred to as "monomer" for convenience), while adopting, as an acid catalyst, one or more kinds of compounds preferably selected from inorganic acids, aliphatic sulfonic acids, and aromatic sulfonic acids.

Examples of the acid catalyst to be used at this time include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The acid catalyst is used in an amount of $10^{-6}$ to 10 moles, preferably $10^{-5}$ to 5 moles, more preferably $10^{-4}$ to 1 mole, relative to 1 mole of monomers.

In addition, The amount of water upon obtainment of the silicon-containing compound from these monomers by hydrolytic condensation, is 0.01 to 100 moles, preferably 0.05 to 50 moles, and more preferably 0.1 to 30 moles, per mole of hydrolyzable substitutional groups bonded to the monomers. Such addition amounts are economical, without using big-sized apparatuses for reactions.

As a manipulation manner, for example, the monomers are added into an aqueous acid catalyst solution obtained by mixing the acid catalyst and water, to cause initiation of a hydrolytic condensation reaction. At this time, the organic solvent may be added into the aqueous acid catalyst solution, or monomers may have been diluted with the organic solvent, or both procedures may be performed. The reaction temperature is usually to be 0 to 100° C., preferably 5 to 80° C. It is a preferable manner to keep the temperature at 5 to 80° C. upon dropping of the monomers, and subsequently mature them at 20 to 80° C.

Examples of organic solvents, which can be added into the aqueous acid catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methylamylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are more preferable among them. Examples thereof include: alcohols such as methanol, ethanol, 1-propanol, and 2-propanol; polyvalent alcohols such as ethylene glycol and propylene glycol; polyvalent alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether; acetone; acetonitrile; and tetrahydrofuran. Those having boiling points of 100° C. or lower are especially preferable among them.

Note that the usage amount of the organic solvent is preferably to be 0 to 1,000 ml, particularly preferably 0 to 500 ml, relative to 1 mole of monomers, because of enabling to conduct economical reactions.

Thereafter, neutralization reaction of the acid catalyst is conducted if necessary. At this time, the amount of an alkaline substance usable for neutralization is preferably 0.1 to 2 equivalents relative to the acid used as the catalyst. This alkaline substance is arbitrary, insofar as the same exhibits alkalinity in water.

Subsequently, it is preferable to remove, from the reaction mixture, a by-product such as an alcohol formed by the hydrolysis condensation reaction by such a method as distillation under reduced pressure. In this removal procedure, a temperature to heat the reaction mixture is preferably 0 to 100° C., more preferably 10 to 90° C., or still more preferably 15 to 80° C., though depending on the organic solvent added, the alcohol formed by the reaction, and the like. The degree of evacuation during the removal procedure is preferably below an atmospheric pressure, more preferably 80 or less KPa by absolute pressure, or still more preferably 50 or less KPa by absolute pressure, though different depending on an exhausting equipment, a condensation equipment, a heating temperature, and an organic solvent, an alcohol, and the like to be removed. During this procedure, it is preferable that about 80% or more by mass of the total alcohol and the like formed be removed, though it is difficult to know exactly the amount of removed alcohol.

Next, it is possible to remove the acid catalyst used for the hydrolytic condensation, from the reaction product mixture. As a procedure for removing the acid catalyst, the silicon-containing compound is mixed with water, and the silicon-containing compound is extracted with an organic solvent.

Suitable as an organic solvent to be used then, is one which allows for dissolution of the silicon-containing compound therein and which is separated in a two-layered manner from water upon mixing therewith. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methylamylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water hardly-soluble organic solvent. Examples of preferable mixtures include, without limited thereto, combinations of methanol+ethyl acetate, ethanol+ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water-hardly soluble organic solvent.

Subsequently, washing may be done by using a neutral water. As to this neutral water, so-called deionized water or ultrapure water may be used. Amount of this neutral water to be used is usually 0.01 to 100 L, preferably 0.05 to 50 L, or more preferably 0.1 to 5 L, relative to 1 L of the reaction mixture solution. The washing may be done by mixing the reaction mixture with the neutral water in a vessel with agitation, settling the resulting mixture, and then separating the aqueous layer therefrom. Number of the washing may be one time or more, or preferably one to five times in order to obtain effective washing.

Since a part of the reaction mixture is sometimes migrated into a water layer by the washing operation at this time to provide an effect substantially equivalent to a fractionation, the number of washing times and the amount of washing water may be appropriately selected in view of the catalyst removal effect and fractionation effect.

Other examples of methods for removing the acid catalyst include a method based on an ion-exchange resin, and a method for conducting neutralization by epoxy compounds such as ethylene oxide and propylene oxide followed by removal. These methods can be appropriately selected in conformity to the acid catalyst for the reaction.

In both cases of a reaction mixture including the acid catalyst left therein and a reaction mixture solution from which the acid catalyst has been removed, a final solvent is added thereto, and solvent exchange is conducted under reduced pressure, to obtain a resultant silicon-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

At this time, the silicon-containing compound is sometimes made unstable, due to exchange of solvents. This phenomenon is caused depending on the compatibility between the final solvent and the silicon-containing compound, and it is possible to add the component (C) to be described later to the solvent before the solvent exchange as a stabilizer, after that to conduct the solvent exchange, so as to prevent the phenomenon.

The amount to be added is 0 to 25 parts by mass, preferably 0 to 15 parts by mass, and more preferably 0 to 5 parts by mass relative to 100 parts by mass of the silicon-containing compound in the solution before solvent exchange, and 0.5 or more parts by mass are preferable in case of addition.

When the silicon-containing compound is concentrated to a certain concentration or denser, condensation reaction is progressed, so that the compound is changed into a state incapable of being re-dissolved in an organic solvent. As such, the compound is to be preferably kept in a solution state at an appropriate concentration. In addition, from the aspect of economical, the suitable concentration in this case is preferably 0.1 to 20 mass %.

Suitable as a final solvent to be added to the silicon-containing compound solution is an alcohol-based solvent, and particularly desirable examples thereof include monoalkyl ether derivatives of: ethylene glycol, diethylene glycol, triethylene glycol, propylene glycol, dipropylene glycol, and butanediol. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

Alternatively, in the case that the solvents are main components, a non-alcoholic solvent may be added as a supplemental solvent. Examples of this supplemental solvents include acetone, tetrahydrofurane, toluene, hexane, ethyl acetate, cyclohexanone, methylamyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

As another operation for reaction, water or water-containing organic solvent is added to the monomers or an organic solution of monomers, to initiate a hydrolysis reaction. At this time, the acid catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

The usage amount of the organic solvent may be the same as the above. The obtained reaction product mixture is post-treated in the same manner as the above, to obtain the silicon-containing compound.

The silicon-containing compound (A) may be produced also by hydrolysis condensation reaction of a monomer in the presence of a base catalyst.

Illustrative example of the base catalyst used therein includes methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclononene, diazabicycloundecene, hexamethylene tetramine, aniline, N,N-dimethyl aniline, pyridine, N,N-dimethylaminopyridine, pyrrole, piperazine, pyrrolidine, piperidine, picoline, tetramethylammonium hydroxide, choline hydroxide, tetrapropyl ammonium hydroxide, tetrabutyl ammonium hydroxide, ammonia, lithium hydroxide, sodium hydroxide, potassium hydroxide, barium hydroxide, and calcium hydroxide.

The base catalyst is used in an amount of $10^{-6}$ to 10 moles, preferably $10^{-5}$ to 5 moles, more preferably $10^{-4}$ to 1 mole, relative to 1 mole of silicon monomers.

The amount of water upon obtainment of the silicon-containing compound from these monomers by hydrolytic condensation, is preferably 0.1 to 50 moles, per mole of hydrolyzable substitutional groups bonded to the monomers. Such addition amounts are economical, without using big-sized apparatuses for reactions.

As a manipulation manner, for example, the monomers are added into an aqueous base catalyst solution, to cause initiation of a hydrolytic condensation reaction. At this time, the organic solvent may be added into the aqueous base catalyst solution, or monomers may have been diluted with the organic solvent, or both procedures may be performed. The reaction temperature is to be 0 to 100° C., preferably 5 to 80° C. It is a preferable manner to keep the temperature at 5 to 80° C. upon dropping of the monomers, and subsequently mature them at 20 to 80° C.

Preferably usable organic solvents that can be added to the aqueous solution of a base catalyst or that can dilute a monomer are those similar to illustratively mentioned organic solvents that can be added to the aqueous solution of an acid catalyst.

Meanwhile, in order to carry out the reaction economically, amount of the organic solvent to be used is preferably 0 to 1000 mL relative to one mole of the monomer.

Thereafter, neutralization reaction of the catalyst is conducted if necessary, and the alcohol produced by the hydrolytic condensation reaction is removed under reduced pressure, thereby obtaining an aqueous solution of reaction product mixture. At this time, the amount of an acid substance usable for neutralization is preferably 0.1 to 2 equivalents relative to the base used as the catalyst. This acid substance is arbitrary, insofar as the same exhibits alkalinity in water.

Subsequently, it is preferable to remove by-products such as alcohols produced by the hydrolytic condensation reaction, from the reaction product mixture. Although the temperature for heating the reaction mixture at this time depends on the kinds of the added organic solvent and alcohols and the like produced by the reaction, the temperature is preferably 0 to 100° C., more preferably 10 to 90° C., and even more preferably 15 to 80° C. Further, although the reduced pressure varies depending on the types of organic solvent and alcohol to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure. Although it is difficult at this time to accurately determine amounts of alcohols to be removed, it is desirable to remove about 80 mass % or more of produced alcohols and the like.

Then, in order to remove the base catalyst used in the hydrolysis condensation reaction, the silicon-containing compound is extracted by an organic solvent. Here, the organic solvent is preferably the one being capable of dissolving the silicon-containing compound and capable of being separated into two layers when mixed with water.

In addition, a mixture of a water-soluble organic solvent and a water-insoluble organic solvent may be used.

Specific examples of the organic solvent used to remove the base catalyst include those specifically mentioned as the examples used to remove the acid catalyst, and similarly, those used for the mixture of a water-soluble organic solvent and a water-insoluble organic solvent.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water-hardly soluble organic solvent.

The procedure is followed by washing by neutral water. Usable as such neutral water is so-called deionized water or ultrapure water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

A final solvent is added to the silicon-containing compound solution after washing, and solvent exchange is conducted under reduced pressure, to obtain a resultant silicon-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

Suitable as the final solvent to be added to the silicon-containing compound solution is an alcohol-based solvent, and particularly desirable examples thereof include monoalkyl ether derivatives of: ethylene glycol, diethylene glycol, triethylene glycol, propylene glycol, and dipropylene glycol. Preferable examples concretely include propylene glycol monomethyl ether, ethylene glycol monomethyl ether, propylene glycol monoethyl ether, ethylene glycol monoethyl ether, propylene glycol monopropyl ether, and ethylene glycol monopropyl ether.

As another operation for reaction, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

Although the molecular weight of the obtained silicon-containing compound can be adjusted not only by selection of monomers but also by control of reaction condition upon polymerization, adoption of compounds having weight-average molecular weights exceeding 100,000 occasionally cause occurrence of extraneous substances or coating patch, so that those compounds are to be preferably used which have weight-average molecular weights of 100,000 or less, preferably 200 to 50,000, and more preferably 300 to 30,000, respectively. Note that the data concerning the weight-average molecular weight is obtained as a molecular weight determined by gel permeation chromatography (GPC) using an RI detector, polystyrene standards as standard substance and tetrahydrofuran as elution solvent.

Meanwhile, the intended silicon-containing compound may also be obtained by mixing two or more silicon-containing compounds obtained from different monomer compositions or obtained from the same monomer composition but prepared under different conditions.

In the present invention, the silicon-containing film-forming composition prepared by preferably blending a thermal crosslinking accelerator (B), an organic acid (C), and an organic solvent (D) into the silicon-containing compound (A) can be used.

Examples of such a thermal crosslinking accelerator (B) include compounds represented by the general formula (B-1) or (B-2):

(B-1)

wherein

L represents litium, natrium, potassium, rubidium, or cesium,

X represents hydroxyl group, and a monovalent or di- or more valent organic acid group having 1 to 30 carbon atoms, a represents an integer of 1 or more, b represents an integer of 0, 1, or more, and a+b represents a valence to be determined by the X, and

(B-2)

wherein

M represents a sulfonium, iodonium, or ammonium, preferable is tertiary sulfonium, secondary iodonium, or quanternary ammonium, and especially preferable is photodegradable one, such as triarylsulfonium compound, or diaryl iodonium compound, A represents the X or non-nucleophilic ion, a' represents an integer of 1 or more, b' represents an integer of 0, 1, or more, and a'+b' represents a valence to be determined by the A.

Examples of the compound represented by the general formula (B-1) include alkali metal salts of organic acids. Examples include salts of lithium, sodium, potassium, rubidium and cesium with monovalent acids such as hydroxide, nitric acid, hydrochloric acid, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, and trichloroacetic acid; and salts of lithium, sodium, potassium, rubidium and cesium with monovalent or divalent acids such as oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, hydrogen carbonic acid, and carbonic acid.

Concrete examples of such a compound include compounds described in paragraph (0126) of Japanese Patent Laid-Open (kokai) No. 2009-126940.

Examples of the compound represented by the general formula (B-2) include sulfonium compounds, iodonium compounds, and ammonium compounds represented by formulae (Q-1), (Q-2), and (Q-3), respectively:

(Q-1)

(Q-2)

(Q-3)

wherein $R^{204}$, $R^{205}$, and $R^{206}$ each represent a linear, branched, or cyclic alkyl, alkenyl, oxoalkyl, or oxoalkenyl group having 1 to 12 carbon atoms, a substituted or unsubstituted aryl group having 6 to 20 carbon atoms, or an aralkyl or aryloxoalkyl group having 7 to 12 carbon atoms, wherein some or all hydrogen atoms of these groups may be substituted by alkoxy groups or the like, and wherein $R^{205}$ and $R^{206}$ may form a ring together with a sulfur atom to which they bond, and when a ring is formed, $R^{205}$ and $R^{206}$ each represent an alkylene group having 1 to 6 carbon atoms;

$A^-$ represents a non-nucleophilic counter ion; and $R^{207}$, $R^{208}$, $R^{209}$, and $R^{210}$ are the same as $R^{204}$, $R^{205}$ and $R^{206}$, and may be a hydrogen atom;

wherein $R^{207}$ and $R^{208}$, or $R^{207}$, $R^{208}$ and $R^{209}$ may form a ring together with a nitrogen atom to which they bond, and when a ring is formed, $R^{207}$ and $R^{208}$, or $R^{207}$, $R^{208}$ and $R^{209}$ represent an alkylene group having 3 to 10 carbon atoms.

Each $R^{204}$, $R^{205}$, $R^{206}$, $R^{207}$, $R^{208}$, $R^{209}$, and $R^{210}$ may be the same or the different, and concrete examples of alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl groups. Examples of alkenyl groups include vinyl, allyl, propenyl, butenyl, hexenyl, and cyclohexenyl groups. Examples of oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl groups. Examples of aryl groups include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl groups; alkylphenyl groups such as 2-methylphenyl, 3-methylphenyl, 4-methylphenyl, ethylphenyl, 4-tert-butylphenyl, 4-butylphenyl, and dimethylphenyl groups; alkylnaphthyl groups such as methylnaphthyl and ethylnaphthyl groups; alkoxynaphthyl groups such as methoxynaphthyl and ethoxynaphthyl groups; dialkylnaphthyl groups such as dimethylnaphthyl and diethylnaphthyl groups; and dialkoxynaphthyl groups such as dimethoxynaphthyl and diethoxynaphthyl groups. Examples of aralkyl groups include benzyl, phenylethyl, and phenethyl groups. Examples of aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl groups.

Examples of $A^-$ include hydroxyl ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, fluoride ion, chloride ion, bromide ion, iodide ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and hycrogencabonate ion.

Concrete examples of such a sulfonyl compound include sulfonyl compounds described in paragraph (0130) in Japanese Patent Laid-Open (kokai) No. 2009-126940, concrete examples of such a iodonium compound include iodonium compounds described in paragraph (0131) in the same, and concrete examples of such a ammonium compound include ammonium compounds described in paragraph (0132) in the same.

Note that the thermal crosslinking accelerators (B) can be used solely in one kind or combinedly in two or more kinds. The addition amount of the thermal crosslinking accelerators (B) is preferably 0.01 to 50 parts by mass, and more preferably 0.1 to 40 parts by mass, relative to 100 parts by mass of the base polymer (i.e., the silicon-containing compound of the component (A) obtained by the above procedure).

To improve stability of the silicon-containing film-forming composition to be used for the present invention, it is preferably to add a monovalent, divalent, or higher organic acid having 1 to 30 carbon atoms as the component (C).

Examples of the acid (C) to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Particularly preferable examples include oxalic acid, maleic acid, formic acid, acetic acid, propionic acid, and citric acid. It is possible to mixingly use two or more kinds of acids, so as to keep the stability.

The addition amount is 0.001 to 25 parts by mass, preferably 0.01 to 15 parts by mass, and more preferably 0.1 to 5 parts by mass, relative to 100 parts by mass of the silicon contained in the composition. Alternatively, the organic acid is preferably blended in a manner to achieve $0 \leq pH \leq 7$, more preferably $0.3 \leq pH \leq 6.5$, and even more preferably $0.5 \leq pH \leq 6$, when evaluated as a pH of the composition.

As the component (D), the same organic solvent as used upon production of the silicon-containing compound (A) as described above can be used, and preferable examples to be used include water-soluble organic solvents, particularly monoalkyl ether of ethylene glycol, diethylene glycol, triethylene glycol, propylene glycol, dipropylene glycol, butanediol, and pentanediol. Concretely used are organic solvents selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

Into the composition used for the patterning process of the present invention may be added water. When water is added thereinto, the silicon-containing compound is hydrated, so that a lithography performance may be improved. Amount of water in the solvent component of the composition is in the range of more than 0% by mass to less than 50% by mass, more preferably 0.3 to 30% by mas, or still more preferably 0.5 to 20% by mass. If amount of each component is too large, uniformity of a coated film becomes poor, whereby crawling occurs in the worst case. On the other hand, if the amount thereof is too small, a lithography performance is deteriorated; and thus it is not desirable.

Amount of totality of the solvent including water is preferably 100 to 100,000 parts by mass, or in particular 200 to 50,000 parts by mass, relative to 100 parts by mass of the base polymer of the component (A).

Into the silicon-containing film-forming composition used for the patterning process of the present invention, a photoacid generator may be added. Concrete examples of photoacid generators to be used for the present invention include a material described in paragraphs (0160) to (0179) of Japanese Patent Laid-Open (kokai) No. 2009-126940.

Further, the silicon-containing film-forming composition can be improved in stability, by adding thereto, as a stabilizer, a monovalent or divalent or higher alcohol having a cyclic ether as a substitutional group, particularly ether compounds represented by the following formulae. Examples thereof include the materials described in paragraphs (0180) to (0184) of Japanese Patent Laid-Open (kokai) No. 2009-126940.

In the composition used for the present invention, it is possible to blend a surfactant, as required. Concrete examples of such a surfactant include a material described in paragraph (0185) of Japanese Patent Laid-Open (kokai) No. 2009-126940.

The silicon-containing film used in the patterning process of the present invention can be formed on a body to be processed by spin coating and so on of the composition for the silicon-containing film, similarly to the method used for the photoresist film. After spin coating, it is preferable that the solvent be evaporated, and then, in order to avoid mixing with the resist film of the upper layer, baking be carried out so as to accelerate a crosslinking reaction. Baking temperature is preferably in the range of 50 to 500° C., and with the time thereof being preferably in the range of 10 to 300 seconds. Especially preferable temperature range thereof is 400° C. or lower to reduce thermal damage to a device, though depending on structure of the device to be produced.

Usable as the body to be processed is a semiconductor substrate formed thereon with a metal film, metal carbide film, metal oxide film, metal nitride film, or metal oxide nitride film, as a process-targeted layer (process-targeted portion).

Although a silicon substrate is typically used as the semiconductor substrate, the latter is not particularly limited and it is possible to use a substrate made of a material such as Si, amorphous silicon ($\alpha$-Si), p-Si, $SiO_2$, SiN, SiON, W, TiN, Al, or the like, which can be different from that of the layer to be processed.

Usable as a metal constituting the body to be processed is silicon, titanium, tungsten, hafnium, zirconium, chromium, germanium, copper, aluminum, iron, or an alloy thereof, and usable as the process-targeted layer containing such a metal is Si, $SiO_2$, SiN, SiON, SiOC, p-Si, α-Si, TiN, WSi, BPSG, SOG, Cr, CrO, CrON, MoSi, W, W-Si, Al, Cu, Al—Si, or the like, or various low dielectric films, or an etching stopper film therefor, for example, which can each be formed to typically have a thickness of 50 to 10,000 nm, and particularly 100 to 5,000 nm.

In the patterning process of the present invention, the photoresist film of the upper layer is of a chemical amplification type, and is not particularly restricted as far as it can form a negative pattern by development using an organic solvent developer.

For example, if the exposure step of the present invention is carried out by an exposure process using an ArF excimer laser beam, any composition used for a usual ArF excimer laser beam may be used as for the resist film of the upper layer.

Already known as such a resist composition for ArF excimer laser are numerous candidates including known resins, which are generally classified into poly(meth)acryl resins, COMA (Cyclo Olefin Maleic Anhydride) resins, COMA-(meth)acryl hybrid resins, ROMP (Ring Opening Methathesis Polymerization) resins, polynorbornene resins, and the like; and resist compositions using poly(meth)acryl resins among them are superior to other type resins in terms of resolution performance because the poly(meth)acryl resins each have an alicyclic structure introduced in its side-chain to thereby ensure an etching resistance.

In the patterning process of the present invention, after the silicon-containing film layer is formed, the photoresist film is formed thereon by using a photoresist composition solution by using preferably a spin coating method, similarly to the case of the silicon-containing film layer. After the resist composition is applied by a spin coating method, pre-baking is carried out, preferably at 80 to 180° C. and for 10 to 300 seconds. Then, this is followed by exposure, post-exposure baking (PEB), and then, the organic solvent development to obtain a negative resist pattern.

As the developer of the organic solvent, it is possible to use the developer containing, as a component(s), one or more kinds selected from among: 2-octanone, 2-nonanone, 2-heptanone, 3-heptanone, 4-heptanone, 2-hexanone, 3-hexanone, diisobutylketone, methylcyclohexanone, acetophenone, and methylacetophenone; propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, and ethyl crotonate; methyl lactate; ethyl lactate; propyl lactate; butyl lactate; isobutyl lactate; amyl lactate; isoamyl lactate; methyl 2-hydroxy-isobutyrate; ethyl 2-hydroxy-isobutyrate; methyl benzoate; ethyl benzoate; phenyl acetate; benzyl acetate; methyl phenylacetate; benzyl formate; phenylethyl formate; methyl 3-phenylpropionate; benzyl propionate; ethyl phenylacetate; and acetic acid 2-phenylethyl, it is preferable to use the developer containing one kind, or two or more kinds of the aforementioned developer components, in a total amount of 50 wt % or more, from standpoints of improving pattern collapse, for example.

Meanwhile, in the patterning process of the present invention, an organic underlayer film, an organic hard mask, or the like may be formed on a body to be processed, followed by formation of the silicon-containing film thereonto.

In the patterning process of the present invention, it may also be possible to transfer the pattern to the silicon-containing film by dry etching by using the negative resist pattern thus obtained as a mask, and then to the body to be processed by dry etching by using the silicon-containing film having the transformed pattern as a mask (so-called "multi-layer resist method").

In the patterning process of the present invention, when the silicon-containing film is etched, the etching is carried out by using a gas mainly comprising a fluorine-containing gas such as a freon gas. In order to reduce film loss of the resist film of the upper layer, it is preferable that the silicon-containing film have a high etching speed to the foregoing gas.

In the multi-layer resist method as mentioned above, in the case that an underlayer film is formed between the silicon-containing film and the body to be processed whereby this underlayer film is used as an etching mask for the body to be processed, the underlayer film is preferably an organic film having an aromatic skeleton; however, in the case that the underlayer film is a sacrificial film or the like, not only the organic film but also a silicon-containing material may be used provided that the silicon amount contained therein is 15% or less by mass.

Many organic underlayer films as mentioned above have been known as the underlayer film for a three-layer resist method or for a bilayer resist method using a silicon resist composition, that is, not only a 4,4'-(9-fluorenylidene) bisphenol novolak resin (molecular weight of 11,000) disclosed in Japanese Patent Laid-Open Publication No. 2005-128509, but also many resins including a novolak resin have been in the public domain as the resist underlayer film material for the bilayer resist method and for the three-layer resist method; and any of them may be used. In addition, if a higher heat resistance than a usual novolak is needed, a polycyclic skeleton such as 6,6'-(9-fluorenylidene)-di(2-naphthol) novolak resin may be included; and further, a polyimide resin may be selected (for example, Japanese Patent Laid-Open Publication No. 2004-153125).

The organic film can be formed on the substrate by using a composition solution in the same manner as the photoresist composition, such as by spin coating. After forming the silicon-containing film by spin coating or the like, it is desirable to bake it to evaporate an organic solvent therefrom. Baking is to be preferably conducted within a temperature range of 80 to 300° C. and within a time range of 10 to 300 seconds.

Note that the thickness of the lower layer film is 5 nm or more, particularly preferably 20 nm or more to 50,000 nm or less without particularly limited thereto though the thickness varies depending on the etching condition; the thickness of the silicon-containing film of the present invention is to be 1 nm or more to 500 nm or less, preferably to be 300 nm or less, more preferably to be 200 nm or less; and the thickness of a photoresist film is preferably between 1 nm or more and 200 nm or less.

The patterning process of the present invention according to the three-layer resist method as mentioned above is done as following (refer to FIG. 1).

In this process, firstly the organic hard mask 2 is formed on the body to be processed 1 by a spin coating method (FIG. 1(A)). It is desired that the organic hard mask 2 have high etching resistance because this acts as a mask during etching of the body to be processed 1; and it is also desired that this undergo crosslinking by heat or an acid after spin coating because mixing with the silicon-containing film of the upper layer is undesirable.

Then, onto it the silicon-containing film 3 and the photoresist film 4 are formed by a spin coating method (FIGS. 1(B) and 1(C)). Meanwhile, the silicon-containing film 3 is formed by using a composition giving the silicon-containing film 3 whose pure-water contact angle in the part corresponding to the exposed area of the photoresist film 4 is in the range of 35 degrees or more to lower than 70 degrees after exposure.

The photoresist film 4 is subjected to a usual pattern exposure using a light source corresponding to the photoresist film 4, such as, for example, a KrF excimer laser beam, an ArF excimer laser beam, an $F_2$ laser beam, and an EUV beam, to form a pattern preferably by any of a photolithography with the wavelength ranging from 10 nm or more to 300 nm or less, a direct drawing by an electron beam, and a nanoimprinting, or a combination of them (FIG. 1 (D)); and thereafter, heat treatment thereof under the condition matching with each photoresist film (FIG. 1 (E)), development by the organic solvent development, and then, as appropriate, rinsing are performed to obtain the negative resist pattern 4a (FIG. 1 (F)).

Then, by using this resist pattern 4a as an etching mask, etching is carried out under the dry etching condition that the etching speed of the silicon-containing film is significantly faster relative to the photoresist film, for example, by dry etching using a fluorine-based gas plasma. As a result, the silicon-containing film pattern 3a can be obtained without substantially receiving an effect of pattern change due to side etching of the resist film (FIG. 1 (G)).

Then, the organic hard mask is dry-etched under the dry etching condition that the etching speed of the organic hard mask is significantly faster relative to the substrate having the silicon-containing film pattern 3a having the transferred resist pattern obtained above, for example, by a reactive dry etching with a gas plasma containing oxygen or by a reactive dry etching with a gas plasma containing hydrogen and nitrogen. In this etching process, the organic hard mask pattern 2a is obtained, while at the same time, the uppermost resist layer is usually lost (FIG. 1 (H)). Then, by using the organic hard mask pattern 2a thereby obtained as an etching mask, the body to be processed can be dry-etched with high precision by using, for example, a fluorine-based dry etching or a chlorine-based dry etching to transfer the pattern 1a to the body to be processed (FIG. 1 (I)).

Meanwhile, in the process of the three-layer resist method mentioned above, an organic underlayer film or an amorphous carbon film formed by a CVD method may also be used instead of the organic hard mask 2. In this case also, the body to be processed can be processed by the procedure similar to the above procedure.

EXAMPLES

Although Synthesis Examples, Examples, and Comparative Examples will be shown and the present invention will be explained in detail hereafter, the present invention is not restricted to the following Examples.

Note that the symbol "%" in the Examples represents a mass %, and the molecular weight measurement was based on GPC.

Synthesis of Silicon-Containing Compound

Synthesis Example 1

Into a mixture of 120 g of methanol, 1 g of methanesulfonic acid, and 60 g of deionized water was added a mixture of 42.7 g of 2-(4-methoxy carbonyl phenyl)ethyl trimethoxy silane (monomer 10), 13.6 g of methyl trimethoxy silane (monomer 2), and 52.0 g of tetraethoxy silane (monomer 4); and then the resulting mixture was kept at 40° C. for 12 hours for hydrolysis-condensation.

After the reaction, 100 g of propylene glycol methyl ether was added thereinto and then by-produced alcohol was removed by distillation under reduced pressure. Then, 1000 mL of ethyl acetate and 300 g of propylene glycol methyl ether were added thereinto, and then a water layer was separated. Into the organic layer remained was added 100 mL of ion-exchanged water; the resulting solution was agitated, settled, and separated into layers. This operation was repeated for 3 times. The organic layer remained was concentrated under reduced pressure to obtain 300 g of a propylene glycol methyl ether solution of silicon-containing compound 1 (10% of polymer concentration).

Methanesulfonate ion could not be detected in the obtained solution by an ion chromatography. Polystyrene equivalent molecular weight (Mw) of the compound was 3,400.

Synthesis Example 2 to Synthesis Example 72

Each synthesis was conducted in the same manner as Synthesis Example 1 by using monomers shown in Table 1-1 to Table 1-4, to obtain the intended compounds (silicon-containing compounds 2 to 72).

TABLE 1-1

| Synthesis Example | Reactive Starting Material | | | | | Mw | Silicon-containing compound |
|---|---|---|---|---|---|---|---|
| 1 | monomer 10 42.7 g | monomer 4 52.0 g | monomer 2 13.6 g | | | 3,400 | 1 |
| 2 | monomer 10 42.7 g | monomer 3 22.8 g | monomer 5 22.8 g | monomer 2 13.6 g | | 3,600 | 2 |
| 3 | monomer 10 42.7 g | monomer 3 22.8 g | monomer 6 22.8 g | monomer 2 13.6 g | | 2,400 | 3 |
| 4 | monomer 11 41.2 g | monomer 1 9.9 g | monomer 3 22.8 g | monomer 7 22.8 g | monomer 2 6.8 g | 3,700 | 4 |
| 5 | monomer 11 41.2 g | monomer 1 9.9 g | monomer 3 22.8 g | monomer 8 22.8 g | monomer 2 6.8 g | 3,900 | 5 |
| 6 | monomer 11 41.2 g | monomer 1 9.9 g | monomer 3 22.8 g | monomer 9 22.8 g | monomer 2 6.8 g | 2,300 | 6 |

TABLE 1-1-continued

| Synthesis Example | Reactive Starting Material | | | | | Mw | Silicon-containing compound |
|---|---|---|---|---|---|---|---|
| 7 | monomer 12 45.7 g | monomer 1 9.9 g | monomer 4 52.0 g | monomer 2 6.8 g | | 2,100 | 7 |
| 8 | monomer 13 45.7 g | monomer 1 9.9 g | monomer 4 52.0 g | monomer 2 6.8 g | | 3,200 | 8 |
| 9 | monomer 13 45.7 g | monomer 1 9.9 g | monomer 3 22.8 g | monomer 5 22.8 g | monomer 2 6.8 g | 3,700 | 9 |
| 10 | monomer 13 45.7 g | monomer 1 9.9 g | monomer 3 22.8 g | monomer 4 22.8 g | monomer 2 6.8 g | 3,300 | 10 |
| 11 | monomer 14 39.1 g | monomer 1 9.9 g | monomer 3 22.8 g | monomer 7 22.8 g | monomer 2 6.8 g | 3,100 | 11 |
| 12 | monomer 14 39.1 g | monomer 1 9.9 g | monomer 3 22.8 g | monomer 8 22.8 g | monomer 2 6.8 g | 3,500 | 12 |
| 13 | monomer 14 39.1 g | monomer 1 9.9 g | monomer 3 22.8 g | monomer 9 22.8 g | monomer 2 6.8 g | 2,600 | 13 |
| 14 | monomer 15 39.7 g | monomer 1 9.9 g | monomer 4 52.0 g | monomer 2 6.8 g | | 3,900 | 14 |
| 15 | monomer 16 47.5 g | monomer 1 9.9 g | monomer 2 52.0 g | monomer 3 6.8 g | | 2,300 | 15 |
| 16 | monomer 16 47.5 g | monomer 1 9.9 g | monomer 3 22.8 g | monomer 5 22.8 g | monomer 2 6.8 g | 2,600 | 16 |
| 17 | monomer 16 47.5 g | monomer 1 9.9 g | monomer 3 22.8 g | monomer 6 22.8 g | monomer 2 6.8 g | 2,800 | 17 |
| 18 | monomer 17 49.0 g | monomer 1 9.9 g | monomer 3 22.8 g | monomer 7 22.8 g | monomer 2 6.8 g | 2,300 | 18 |

TABLE 1-2

| Synthesis Example | Reactive Starting Material | | | | | Mw | Silicon-containing compound |
|---|---|---|---|---|---|---|---|
| 19 | monomer 17 49.0 g | monomer 1 9.9 g | monomer 3 22.8 g | monomer 8 22.8 g | monomer 2 6.8 g | 3,700 | 19 |
| 20 | monomer 17 49.0 g | monomer 1 9.9 g | monomer 3 22.8 g | monomer 9 22.8 g | monomer 2 6.8 g | 2,100 | 20 |
| 21 | monomer 18 62.5 g | monomer 1 9.9 g | monomer 4 52.0 g | monomer 2 6.8 g | | 2,800 | 21 |
| 22 | monomer 19 57.4 g | monomer 4 52.0 g | monomer 2 13.6 g | | | 2,100 | 22 |
| 23 | monomer 20 53.5 g | monomer 4 52.0 g | monomer 2 13.6 g | | | 3,900 | 23 |
| 24 | monomer 21 39.1 g | monomer 1 9.9 g | monomer 4 52.0 g | monomer 2 6.8 g | | 2,400 | 24 |
| 25 | monomer 21 39.1 g | monomer 1 9.9 g | monomer 3 22.8 g | monomer 5 22.8 g | monomer 2 6.8 g | 3,800 | 25 |
| 26 | monomer 21 39.1 g | monomer 1 9.9 g | monomer 3 22.8 g | monomer 6 22.8 g | monomer 2 6.8 g | 3,800 | 26 |
| 27 | monomer 22 34.2 g | monomer 3 22.8 g | monomer 7 22.8 g | monomer 2 13.6 g | | 3,900 | 27 |
| 28 | monomer 22 34.2 g | monomer 3 22.8 g | monomer 8 22.8 g | monomer 2 13.6 g | | 3,700 | 28 |

TABLE 1-2-continued

| Synthesis Example | Reactive Starting Material | | | | | Mw | Silicon-containg compound |
|---|---|---|---|---|---|---|---|
| 29 | monomer 22 34.2 g | monomer 3 22.8 g | monomer 9 22.8 g | monomer 2 13.6 g | | 2,200 | 29 |
| 30 | monomer 23 38.8 g | monomer 4 52.0 g | monomer 2 13.6 g | | | 2,600 | 30 |
| 31 | monomer 24 35.5 g | monomer 1 9.9 g | monomer 4 52.0 g | monomer 2 6.8 g | | 3,300 | 31 |
| 32 | monomer 25 39.7 g | monomer 1 9.9 g | monomer 4 52.0 g | monomer 2 6.8 g | | 2,800 | 32 |
| 33 | monomer 26 35.5 g | monomer 1 9.9 g | monomer 4 52.0 g | monomer 2 6.8 g | | 2,900 | 33 |
| 34 | monomer 27 47.8 g | monomer 1 9.9 g | monomer 4 52.0 g | monomer 2 6.8 g | | 3,000 | 34 |
| 35 | monomer 27 47.8 g | monomer 1 9.9 g | monomer 3 22.8 g | monomer 5 22.8 g | monomer 2 6.8 g | 3,000 | 35 |
| 36 | monomer 27 47.8 g | monomer 1 9.9 g | monomer 3 22.8 g | monomer 6 22.8 g | monomer 2 6.8 g | 3,800 | 36 |

TABLE 1-3

| Synthesis Example | Reactive Starting Material | | | | | Mw | Silicon-containg compound |
|---|---|---|---|---|---|---|---|
| 37 | monomer 28 44.8 g | monomer 3 22.8 g | monomer 7 22.8 g | monomer 2 13.6 g | | 3,800 | 37 |
| 38 | monomer 28 44.8 g | monomer 3 22.8 g | monomer 8 22.8 g | monomer 2 13.6 g | | 2,500 | 38 |
| 39 | monomer 28 44.8 g | monomer 3 22.8 g | monomer 9 22.8 g | monomer 2 13.6 g | | 2,800 | 39 |
| 40 | monomer 29 49.6 g | monomer 4 52.0 g | monomer 2 13.6 g | | | 3,800 | 40 |
| 41 | monomer 29 49.6 g | monomer 3 22.8 g | monomer 5 22.8 g | monomer 2 13.6 g | | 3,500 | 41 |
| 42 | monomer 29 49.6 g | monomer 3 22.8 g | monomer 6 22.8 g | monomer 2 13.6 g | | 3,300 | 42 |
| 43 | monomer 30 53.5 g | monomer 3 22.8 g | monomer 7 22.8 g | monomer 2 13.6 g | | 2,900 | 43 |
| 44 | monomer 30 53.5 g | monomer 3 22.8 g | monomer 8 22.8 g | monomer 2 13.6 g | | 3,100 | 44 |
| 45 | monomer 30 53.5 g | monomer 3 22.8 g | monomer 9 22.8 g | monomer 2 13.6 g | | 2,900 | 45 |
| 46 | monomer 31 52.0 g | monomer 4 52.0 g | monomer 2 13.6 g | | | 2,100 | 46 |
| 47 | monomer 32 53.2 g | monomer 4 52.0 g | monomer 2 13.6 g | | | 3,700 | 47 |
| 48 | monomer 33 43.0 g | monomer 1 9.9 g | monomer 4 52.0 g | monomer 2 6.8 g | | 2,600 | 48 |
| 49 | monomer 33 43.0 g | monomer 1 9.9 g | monomer 3 22.8 g | monomer 5 22.8 g | monomer 2 6.8 g | 2,100 | 49 |
| 50 | monomer 33 43.0 g | monomer 1 9.9 g | monomer 3 22.8 g | monomer 6 22.8 g | monomer 2 6.8 g | 3,000 | 50 |

TABLE 1-3-continued

| Synthesis Example | Reactive Starting Material | | | | | Mw | Silicon-containing compound |
|---|---|---|---|---|---|---|---|
| 51 | monomer 34 40.9 g | monomer 1 9.9 g | monomer 3 22.8 g | monomer 7 22.8 g | monomer 2 6.8 g | 2,500 | 51 |
| 52 | monomer 34 40.9 g | monomer 1 9.9 g | monomer 3 22.8 g | monomer 8 22.8 g | monomer 2 6.8 g | 3,600 | 52 |
| 53 | monomer 34 40.9 g | monomer 1 9.9 g | monomer 3 22.8 g | monomer 9 22.8 g | monomer 2 6.8 g | 2,400 | 53 |
| 54 | monomer 35 45.1 g | monomer 1 9.9 g | monomer 4 38.1 g | monomer 2 6.8 g | | 3,300 | 54 |

TABLE 1-4

| Synthesis Example | Reactive Starting Material | | | | Mw | Silicon-containing compound |
|---|---|---|---|---|---|---|
| 55 | monomer 36 43.3 g | monomer 1 9.9 g | monomer 4 38.1 g | monomer 2 6.8 g | 3,500 | 55 |
| 56 | monomer 37 49.6 g | monomer 1 9.9 g | monomer 4 38.1 g | monomer 2 6.8 g | 3,600 | 56 |
| 57 | monomer 38 47.2 g | monomer 1 9.9 g | monomer 4 38.1 g | monomer 2 6.8 g | 2,900 | 57 |
| 58 | monomer 39 37.3 g | monomer 1 9.9 g | monomer 4 38.1 g | monomer 2 6.8 g | 3,900 | 58 |
| 59 | monomer 40 43.3 g | monomer 1 9.9 g | monomer 4 38.1 g | monomer 2 6.8 g | 2,300 | 59 |
| 60 | monomer 41 47.8 g | monomer 1 9.9 g | monomer 4 38.1 g | monomer 2 6.8 g | 2,800 | 60 |
| 61 | monomer 42 40.6 g | monomer 4 38.1 g | monomer 2 13.6 g | | 2,100 | 61 |
| 62 | monomer 42 40.6 g | monomer 3 22.8 g | monomer 5 22.8 g | monomer 2 13.6 g | 2,700 | 62 |
| 63 | monomer 42 40.6 g | monomer 3 22.8 g | monomer 6 22.8 g | monomer 2 13.6 g | 3,200 | 63 |
| 64 | monomer 43 42.7 g | monomer 3 22.8 g | monomer 7 22.8 g | monomer 2 13.6 g | 3,400 | 64 |
| 65 | monomer 43 42.7 g | monomer 3 22.8 g | monomer 8 22.8 g | monomer 2 13.6 g | 2,400 | 65 |
| 66 | monomer 43 42.7 g | monomer 3 22.8 g | monomer 9 22.8 g | monomer 2 13.6 g | 3,200 | 66 |
| 67 | monomer 44 43.3 g | monomer 4 38.1 g | monomer 2 13.6 g | | 3,700 | 67 |
| 68 | monomer 45 46.0 g | monomer 4 38.1 g | monomer 2 13.6 g | | 3,100 | 68 |
| 69 | monomer 46 42.7 g | monomer 1 9.9 g | monomer 3 45.6 g | monomer 2 6.8 g | 3,000 | 69 |
| 70 | monomer 47 42.7 g | monomer 3 45.6 g | monomer 2 6.8 g | | 3,300 | 70 |
| 71 | monomer 1 9.9 g | monomer 4 62.4 g | monomer 2 27.2 g | | 2,300 | 71 |

TABLE 1-4-continued

| Synthesis Example | Reactive Starting Material | | | | Mw | Silicon-containing compound |
|---|---|---|---|---|---|---|
| 72 | monomer 1 9.9 g | monomer 3 38.1 g | monomer 7 38.1 g | monomer 2 13.6 g | 2,500 | 72 |

Note that monomers 1 to 47 shown in Table 1-1 to Table 1-4 are monomers shown in Table 2-1 to Table 2-3.

TABLE 2-1

| monomer 1 | monomer 2 | monomer 3 | monomer 4 |
|---|---|---|---|
| PhSi(OCH$_3$)$_3$ | CH$_3$Si(OCH$_3$)$_3$ | Si(OCH$_3$)$_4$ | Si(OC$_2$H$_5$)$_4$ |

| monomer 5 | monomer 6 | monomer 7 | monomer 8 | monomer 9 |
|---|---|---|---|---|
| P$_2$O$_5$ | Al[CH$_3$COCH=C(O—)CH$_3$]$_3$ | B(OC$_3$H$_7$)$_3$ | Ti(OC$_4$H$_9$)$_4$ | Ge(OC$_4$H$_9$)$_4$ |

TABLE 202 monomer 10
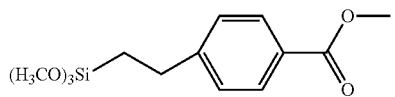

monomer 11
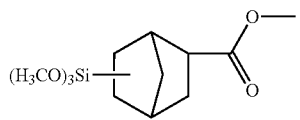

monomer 12
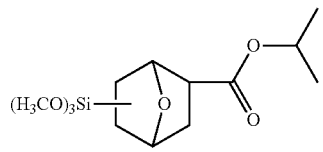

monomer 13
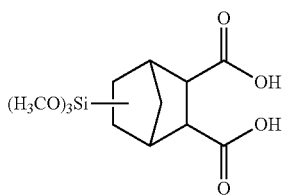

monomer 14
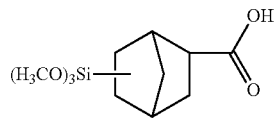

monomer 15
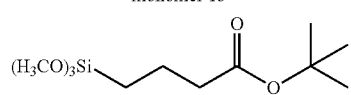

TABLE 202-continued monomer 16

monomer 17
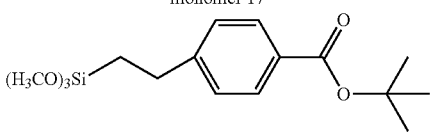

monomer 18
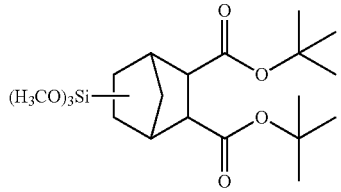

monomer 19
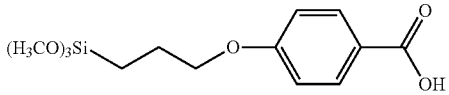

monomer 20
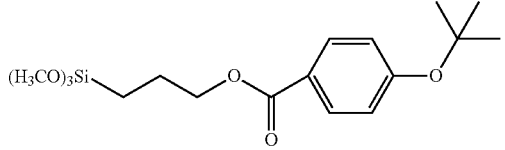

monomer 21
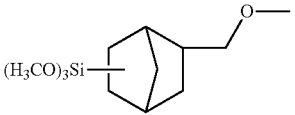

TABLE 202-continued monomers 22–42 (structures shown)

TABLE 202-continued

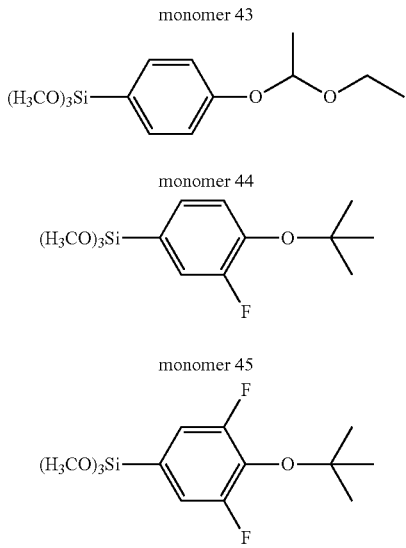

monomer 43 monomer 44 monomer 45

TABLE 2-3

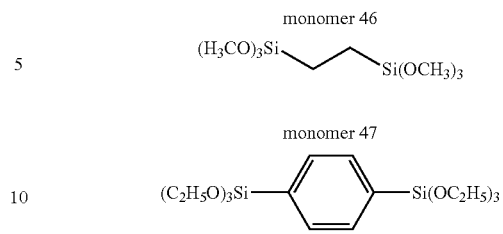

monomer 46 monomer 47

Examples and Comparative Examples

The silicon-containing compounds 1 to 72 obtained in the Synthesis Examples, an organic acid, a thermal crosslinking accelerator, a solvent, and an additive were mixed with one another at ratios listed in Table 3-1 to Table 3-5, respectively, followed by filtration by a filter made of fluororesin of a 0.1 μm size, to prepare silicon-containing film-forming composition solutions named Sol. 1 to 91, respectively.

TABLE 3-1

| No. | Silicon-containg compound (parts by mass) | Thermal crosslinking accelerator (parts by mass) | Photo acid generator (parts by mass) | Acid (parts by mass) | Solvent (parts by mass) | Water (parts by mass) |
|---|---|---|---|---|---|---|
| Sol. 1 | compound 1 (4.0) | TPSOH (0.04) | not contain | maleic acid (0.04) | PGME (150) | water (15) |
| Sol. 2 | compound 1 (4.0) | TPSHCO$_3$ (0.04) | not contain | oxalic acid (0.04) | PGME (150) | water (15) |
| Sol. 3 | compound 1 (4.0) | TPSOx (0.04) | not contain | maleic acid (0.04) | PGME (150) | water (15) |
| Sol. 4 | compound 1 (4.0) | TPSTFA (0.04) | not contain | maleic acid (0.04) | PGME (150) | water (15) |
| Sol. 5 | compound 1 (4.0) | TPSOCOPh (0.04) | not contain | oxalic acid (0.04) | PGME (150) | water (15) |
| Sol. 6 | compound 1 (4.0) | TPSH$_2$PO$_4$ (0.04) | not contain | oxalic acid (0.04) | PGME (150) | water (15) |
| Sol. 7 | compound 1 (4.0) | QMAMA (0.04) | not contain | maleic acid (0.04) | PGME (150) | water (15) |
| Sol. 8 | compound 1 (4.0) | QBANO$_3$ (0.04) | not contain | maleic acid (0.04) | PGME (150) | water (15) |
| Sol. 9 | compound 1 (4.0) | QMATFA (0.04) | not contain | maleic acid (0.04) | PGME (150) | water (15) |
| Sol. 10 | compound 1 (4.0) | Ph$_2$ICl (0.04) | not contain | maleic acid (0.04) | PGME (150) | water (15) |
| Sol. 11 | compound 1 (4.0) | not contain | not contain | maleic acid (0.04) | PGME (150) | water (15) |
| Sol. 12 | compound 2 (4.0) | TPSMA (0.04) | not contain | maleic acid (0.04) | PGME (150) | water (15) |
| Sol. 13 | compound 3 (4.0) | TPSMA (0.04) | not contain | maleic acid (0.04) | PGME (150) | water (15) |
| Sol. 14 | compound 4 (4.0) | TPSMA (0.04) | not contain | maleic acid (0.04) | PGME (150) | water (15) |
| Sol. 15 | compound 5 (4.0) | TPSMA (0.04) | not contain | maleic acid (0.04) | PGME (150) | water (15) |
| Sol. 16 | compound 6 (4.0) | TPSMA (0.04) | not contain | maleic acid (0.04) | PGME (150) | water (15) |
| Sol. 17 | compound 7 (4.0) | TPSMA (0.04) | not contain | maleic acid (0.04) | PGME (150) | water (15) |
| Sol. 18 | compound 8 (4.0) | TPSMA (0.04) | not contain | maleic acid (0.04) | PGME (150) | water (15) |
| Sol. 19 | compound 9 (4.0) | TPSMA (0.04) | not contain | maleic acid (0.04) | PGME (150) | water (15) |
| Sol. 20 | compound 10 (4.0) | TPSMA (0.04) | not contain | maleic acid (0.04) | PGME (150) | water (15) |

TABLE 3-2

| No. | Silicon-containing compound (parts by mass) | Thermal crosslinking accelerator (parts by mass) | Photo acid generator (parts by mass) | Acid (parts by mass) | Solvent (parts by mass) | Water (parts by mass) |
|---|---|---|---|---|---|---|
| Sol. 21 | compound 11 (4.0) | TPSMA (0.04) | not contain | maleic acid (0.04) | PGME (150) | water (15) |
| Sol. 22 | compound 12 (4.0) | TPSMA (0.04) | not contain | maleic acid (0.04) | PGME (150) | water (15) |
| Sol. 23 | compound 13 (4.0) | TPSMA (0.04) | not contain | maleic acid (0.04) | PGME (150) | water (15) |
| Sol. 24 | compound 14 (4.0) | TPSMA (0.04) | not contain | maleic acid (0.04) | PGME (150) | water (15) |
| Sol. 25 | compound 15 (4.0) | TPSMA (0.04) | not contain | maleic acid (0.04) | PGME (150) | water (15) |
| Sol. 26 | compound 16 (4.0) | TPSMA (0.04) | not contain | maleic acid (0.04) | PGME (150) | water (15) |
| Sol. 27 | compound 17 (4.0) | TPSMA (0.04) | not contain | maleic acid (0.04) | PGME (150) | water (15) |
| Sol. 28 | compound 18 (4.0) | TPSMA (0.04) | not contain | maleic acid (0.04) | PGME (150) | water (15) |
| Sol. 29 | compound 19 (4.0) | TPSMA (0.04) | not contain | maleic acid (0.04) | PGME (150) | water (15) |
| Sol. 30 | compound 20 (4.0) | TPSMA (0.04) | not contain | maleic acid (0.04) | PGME (150) | water (15) |
| Sol. 31 | compound 21 (4.0) | TPSMA (0.04) | not contain | maleic acid (0.04) | PGME (150) | water (15) |
| Sol. 32 | compound 22 (4.0) | TPSMA (0.04) | not contain | maleic acid (0.04) | PGME (150) | water (15) |
| Sol. 33 | compound 23 (4.0) | TPSMA (0.04) | not contain | maleic acid (0.04) | PGME (150) | water (15) |
| Sol. 34 | compound 24 (4.0) | TPSMA (0.04) | not contain | maleic acid (0.04) | PGME (150) | water (15) |
| Sol. 35 | compound 25 (4.0) | TPSMA (0.04) | not contain | maleic acid (0.04) | PGME (150) | water (15) |
| Sol. 36 | compound 26 (4.0) | TPSMA (0.04) | not contain | maleic acid (0.04) | PGME (150) | water (15) |
| Sol. 37 | compound 27 (4.0) | TPSMA (0.04) | not contain | maleic acid (0.04) | PGME (150) | water (15) |
| Sol. 38 | compound 28 (4.0) | TPSMA (0.04) | not contain | maleic acid (0.04) | PGME (150) | water (15) |
| Sol. 39 | compound 29 (4.0) | TPSMA (0.04) | not contain | maleic acid (0.04) | PGME (150) | water (15) |
| Sol. 40 | compound 30 (4.0) | TPSMA (0.04) | not contain | maleic acid (0.04) | PGME (150) | water (15) |

TABLE 3-3

| No. | Silicon-containing compound (parts by mass) | Thermal crosslinking accelerator (parts by mass) | Photo acid generator (parts by mass) | Acid (parts by mass) | Solvent (parts by mass) | Water (parts by mass) |
|---|---|---|---|---|---|---|
| Sol. 41 | compound 31 (4.0) | TPSMA (0.04) | not contain | maleic acid (0.04) | PGME (150) | water (15) |
| Sol. 42 | compound 32 (4.0) | TPSMA (0.04) | not contain | maleic acid (0.04) | PGME (150) | water (15) |
| Sol. 43 | compound 33 (4.0) | TPSMA (0.04) | not contain | maleic acid (0.04) | PGME (150) | water (15) |
| Sol. 44 | compound 34 (4.0) | TPSMA (0.04) | not contain | maleic acid (0.04) | PGME (150) | water (15) |
| Sol. 45 | compound 35 (4.0) | TPSMA (0.04) | not contain | maleic acid (0.04) | PGME (150) | water (15) |
| Sol. 46 | compound 36 (4.0) | TPSMA (0.04) | not contain | maleic acid (0.04) | PGME (150) | water (15) |
| Sol. 47 | compound 37 (4.0) | TPSMA (0.04) | not contain | maleic acid (0.04) | PGME (150) | water (15) |
| Sol. 48 | compound 38 (4.0) | TPSMA (0.04) | not contain | maleic acid (0.04) | PGME (150) | water (15) |
| Sol. 49 | compound 39 (4.0) | TPSMA (0.04) | not contain | maleic acid (0.04) | PGME (150) | water (15) |
| Sol. 50 | compound 40 (4.0) | TPSMA (0.04) | not contain | maleic acid (0.04) | PGME (150) | water (15) |
| Sol. 51 | compound 41 (4.0) | TPSMA (0.04) | not contain | maleic acid (0.04) | PGME (150) | water (15) |

TABLE 3-3-continued

| No. | Silicon-containing compound (parts by mass) | Thermal crosslinking accelerator (parts by mass) | Photo acid generator (parts by mass) | Acid (parts by mass) | Solvent (parts by mass) | Water (parts by mass) |
|---|---|---|---|---|---|---|
| Sol. 52 | compound 42 (4.0) | TPSMA (0.04) | not contain | maleic acid (0.04) | PGME (150) | water (15) |
| Sol. 53 | compound 43 (2.0) | TPSMA (0.04) | not contain | maleic acid (0.04) | PGME (150) | water (15) |
| Sol. 54 | compound 44 (2.0) | TPSMA (0.04) | not contain | maleic acid (0.04) | PGME (150) | water (15) |
| Sol. 55 | compound 45 (2.0) | TPSMA (0.04) | not contain | maleic acid (0.04) | PGME (150) | water (15) |
| Sol. 56 | compound 46 (2.0) | TPSMA (0.04) | not contain | maleic acid (0.04) | PGME (150) | water (15) |
| Sol. 57 | compound 47 (2.0) | TPSMA (0.04) | not contain | maleic acid (0.04) | PGME (150) | water (15) |
| Sol. 58 | compound 48 (4.0) | TPSMA (0.04) | not contain | maleic acid (0.04) | PGME (150) | water (15) |
| Sol. 59 | compound 49 (4.0) | TPSMA (0.04) | not contain | maleic acid (0.04) | PGME (150) | water (15) |
| Sol. 60 | compound 50 (4.0) | TPSMA (0.04) | not contain | maleic acid (0.04) | PGME (150) | water (15) |

TABLE 3-4

| No. | Silicon-containing compound (parts by mass) | Thermal crosslinking accelerator (parts by mass) | Photo acid generator (parts by mass) | Acid (parts by mass) | Solvent (parts by mass) | Water (parts by mass) |
|---|---|---|---|---|---|---|
| Sol. 61 | compound 51 (4.0) | TPSMA (0.04) | not contain | maleic acid (0.04) | PGME (150) | water (15) |
| Sol. 62 | compound 52 (4.0) | TPSMA (0.04) | not contain | maleic acid (0.04) | PGME (150) | water (15) |
| Sol. 63 | compound 53 (4.0) | TPSMA (0.04) | not contain | maleic acid (0.04) | PGME (150) | water (15) |
| Sol. 64 | compound 54 (4.0) | TPSMA (0.04) | not contain | maleic acid (0.04) | PGME (150) | water (15) |
| Sol. 65 | compound 55 (4.0) | TPSMA (0.04) | not contain | maleic acid (0.04) | PGME (150) | water (15) |
| Sol. 66 | compound 56 (4.0) | TPSMA (0.04) | not contain | maleic acid (0.04) | PGME (150) | water (15) |
| Sol. 67 | compound 57 (4.0) | TPSMA (0.04) | not contain | maleic acid (0.04) | PGME (150) | water (15) |
| Sol. 68 | compound 58 (4.0) | TPSMA (0.04) | not contain | maleic acid (0.04) | PGME (150) | water (15) |
| Sol. 69 | compound 59 (4.0) | TPSMA (0.04) | not contain | maleic acid (0.04) | PGME (150) | water (15) |
| Sol. 70 | compound 60 (4.0) | TPSMA (0.04) | not contain | maleic acid (0.04) | PGME (150) | water (15) |
| Sol. 71 | compound 61 (4.0) | TPSMA (0.04) | not contain | maleic acid (0.04) | PGME (150) | water (15) |
| Sol. 72 | compound 62 (4.0) | TPSMA (0.04) | not contain | maleic acid (0.04) | PGME (150) | water (15) |
| Sol. 73 | compound 63 (4.0) | TPSMA (0.04) | not contain | maleic acid (0.04) | PGME (150) | water (15) |
| Sol. 74 | compound 64 (4.0) | TPSMA (0.04) | not contain | maleic acid (0.04) | PGME (150) | water (15) |
| Sol. 75 | compound 65 (4.0) | TPSMA (0.04) | not contain | maleic acid (0.04) | PGME (150) | water (15) |
| Sol. 76 | compound 66 (4.0) | TPSMA (0.04) | not contain | maleic acid (0.04) | PGME (150) | water (15) |
| Sol. 77 | compound 67 (4.0) | TPSMA (0.04) | not contain | maleic acid (0.04) | PGME (150) | water (15) |
| Sol. 78 | compound 68 (4.0) | TPSMA (0.04) | not contain | maleic acid (0.04) | PGME (150) | water (15) |
| Sol. 79 | compound 69 (4.0) | TPSMA (0.04) | not contain | maleic acid (0.04) | PGME (150) | water (15) |
| Sol. 80 | compound 70 (4.0) | TPSMA (0.04) | not contain | maleic acid (0.04) | PGME (150) | water (15) |

TABLE 3-5

| No. | Silicon-containing compound (parts by mass) | Thermal crosslinking accelerator (parts by mass) | Photo acid generator (parts by mass) | Acid (parts by mass) | Solvent (parts by mass) | Water (parts by mass) |
|---|---|---|---|---|---|---|
| Sol. 81 | compound 18 (4.0) | TPSMA (0.04) | TPSNf (0.04) | maleic acid (0.04) | PGME (150) | water (15) |
| Sol. 82 | compound 21 (4.0) | TPSMA (0.04) | TPSNf (0.04) | maleic acid (0.04) | PGME (150) | water (15) |
| Sol. 83 | compound 37 (4.0) | TPSMA (0.04) | TPSNf (0.04) | maleic acid (0.04) | PGME (150) | water (15) |
| Sol. 84 | compound 38 (4.0) | TPSMA (0.04) | TPSNf (0.04) | maleic acid (0.04) | PGME (150) | water (15) |
| Sol. 85 | compound 64 (4.0) | TPSMA (0.04) | TPSNf (0.04) | maleic acid (0.04) | PGME (150) | water (15) |
| Sol. 86 | compound 68 (4.0) | TPSMA (0.04) | TPSNf (0.04) | maleic acid (0.04) | PGME (150) | water (15) |
| Sol. 87 | compound 17 (2.0) compound 31 (2.0) | TPSMA (0.04) | not contain | maleic acid (0.04) | PGME (150) | water (15) |
| Sol. 88 | compound 31 (2.0) compound 37 (2.0) | TPSMA (0.04) | not contain | maleic acid (0.04) | PGME (150) | water (15) |
| Sol. 89 | compound 11 (2.0) compound 61 (2.0) | TPSMA (0.04) | not contain | maleic acid (0.04) | PGME (150) | water (15) |
| Sol. 90 | compound 71 (4.0) | TPSMA (0.04) | not contain | maleic acid (0.04) | PGME (150) | water (15) |
| Sol. 91 | compound 72 (4.0) | TPSMA (0.04) | not contain | maleic acid (0.04) | PGME (150) | water (15) |

TPSOH: triphenylsulfonium hydroxide
TPSHCO$_3$: mono-(triphenylsulfonium) carbonate
TPSOx: mono-(triphenylsulfonium) oxalate
TPSTFA: triphenylsulfonium trifluoroacetate
TPSOCOPh: triphenylsulfonium benzoate
TPSH$_2$PO$_4$: mono-(triphenylsulfonium) phosphate
TPSMA: mono-(triphenylsulfonium) maleate
TPSNf: triphenylsulfonium nonafulorobutan sulfonate
QMAMA: mono-(tetramethyl ammonium) maleate
QMATFA: tetramethyl ammonium trifluoroacetate
QBANO$_3$: tetrabuthyl ammonium nitrate
Ph$_2$ICl: diphenyl iodonium chloride
PGME: propyleneglycol monomethyl ether

[Measurement of the Contact Angle]

On a silicon wafer was applied a composition solution for the silicon-containing film (Sol. 1 to Sol. 91), and then it was heated at 240° C. for 60 seconds to obtain a silicon-containing film having film thickness of 35 nm (Film 1 to Film 91); and then, the pure-water contact angle thereof was measured (Table 4).

On top of it, an ArF resist solution shown in Table 7 was applied and then baked at 100° C. for 60 seconds to form the photoresist film having the film thickness of 100 nm. Then, entire surface thereof was exposed by using an ArF immersion exposure apparatus (NSR-S610C; manufactured by Nikon Corp.), and then, it was baked at 100° C. for 60 seconds (PEB). Thereafter, a butyl acetate developer was ejected for three seconds from a developer nozzle while rotating the wafer at 30 rpm; and then, after stopping the rotation, a puddle development was performed for 27 seconds, spin-drying was done after rinsing with diisoamyl ether, and then baking was done at 100° C. for 20 seconds to evaporate the rinsing solvent. The remaining resist film was totally removed by rinsing with PGME to obtain the silicon-containing film after exposure. The pure-water contact angle thereof was also measured (Table 5).

Further, ArF resist solutions listed in Table 7 were each coated on a silicon wafer, baked at 100° C. for 60 seconds to prepare a photoresist film having a thickness of 100 nm, followed by measurement of a contact angle with pure water (Table 6). Next, the same resist films were each subjected to exposure over a whole surface by an ArF immersion exposure apparatus (NSR-S610C; manufactured by Nikon Corp.), and to baking at 100° C. for 60 seconds (PEB), to thereby prepare an ArF resist film having lost an acid-labile group, followed by measurement of a contact angle with pure water (Table 6).

TABLE 4

| No. | contact angle |
|---|---|
| Film1 | 69° |
| Film2 | 70° |
| Film3 | 69° |
| Film4 | 71° |
| Film5 | 71° |
| Film6 | 70° |
| Film7 | 70° |
| Film8 | 69° |
| Film9 | 72° |
| Film10 | 72° |
| Film11 | 72° |
| Film12 | 70° |
| Film13 | 70° |
| Film14 | 72° |

TABLE 4-continued

| No. | contact angle |
|---|---|
| Film15 | 68° |
| Film16 | 69° |
| Film17 | 72° |
| Film18 | 44° |
| Film19 | 44° |
| Film20 | 47° |
| Film21 | 52° |
| Film22 | 48° |
| Film23 | 51° |
| Film24 | 71° |
| Film25 | 72° |
| Film26 | 72° |
| Film27 | 71° |
| Film28 | 73° |
| Film29 | 77° |
| Film30 | 74° |
| Film31 | 75° |
| Film32 | 49° |
| Film33 | 74° |
| Film34 | 69° |
| Film35 | 71° |
| Film36 | 72° |
| Film37 | 72° |
| Film38 | 69° |
| Film39 | 72° |
| Film40 | 72° |
| Film41 | 65° |
| Film42 | 69° |
| Film43 | 72° |
| Film44 | 66° |
| Film45 | 65° |
| Film46 | 66° |
| Film47 | 71° |
| Film48 | 72° |
| Film49 | 72° |
| Film50 | 77° |
| Film51 | 75° |
| Film52 | 74° |
| Film53 | 77° |
| Film54 | 77° |
| Film55 | 78° |
| Film56 | 80° |
| Film57 | 74° |
| Film58 | 59° |
| Film59 | 60° |
| Film60 | 60° |
| Film61 | 60° |
| Film62 | 59° |
| Film63 | 61° |
| Film64 | 41° |
| Film65 | 43° |
| Film66 | 40° |
| Film67 | 57° |
| Film68 | 63° |
| Film69 | 60° |
| Film70 | 60° |
| Film71 | 75° |
| Film72 | 79° |
| Film73 | 76° |
| Film74 | 45° |
| Film75 | 44° |
| Film76 | 46° |
| Film77 | 79° |
| Film78 | 79° |
| Film79 | 55° |
| Film80 | 47° |
| Film81 | 76° |
| Film82 | 77° |
| Film83 | 64° |
| Film84 | 75° |
| Film85 | 78° |
| Film86 | 79° |
| Film87 | 70° |
| Film88 | 67° |
| Film89 | 55° |
| Film90 | 75° |
| Film91 | 74° |

TABLE 5

| No. | contact angle |
|---|---|
| Film1 | 65° |
| Film2 | 65° |
| Film3 | 65° |
| Film4 | 69° |
| Film5 | 69° |
| Film6 | 69° |
| Film7 | 67° |
| Film8 | 65° |
| Film9 | 67° |
| Film10 | 67° |
| Film11 | 68° |
| Film12 | 68° |
| Film13 | 68° |
| Film14 | 69° |
| Film15 | 69° |
| Film16 | 69° |
| Film17 | 67° |
| Film18 | 42° |
| Film19 | 42° |
| Film20 | 42° |
| Film21 | 47° |
| Film22 | 47° |
| Film23 | 47° |
| Film24 | 51° |
| Film25 | 47° |
| Film26 | 47° |
| Film27 | 47° |
| Film28 | 50° |
| Film29 | 50° |
| Film30 | 50° |
| Film31 | 44° |
| Film32 | 48° |
| Film33 | 48° |
| Film34 | 65° |
| Film35 | 65° |
| Film36 | 65° |
| Film37 | 68° |
| Film38 | 68° |
| Film39 | 68° |
| Film40 | 66° |
| Film41 | 43° |
| Film42 | 47° |
| Film43 | 67° |
| Film44 | 61° |
| Film45 | 61° |
| Film46 | 61° |
| Film47 | 51° |
| Film48 | 51° |
| Film49 | 51° |
| Film50 | 52° |
| Film51 | 52° |
| Film52 | 52° |
| Film53 | 56° |
| Film54 | 56° |
| Film55 | 56° |
| Film56 | 58° |
| Film57 | 53° |
| Film58 | 60° |
| Film59 | 60° |
| Film60 | 60° |
| Film61 | 57° |
| Film62 | 57° |
| Film63 | 57° |
| Film64 | 37° |
| Film65 | 36° |
| Film66 | 35° |
| Film67 | 57° |
| Film68 | 58° |
| Film69 | 57° |
| Film70 | 57° |
| Film71 | 48° |
| Film72 | 48° |
| Film73 | 48° |
| Film74 | 43° |
| Film75 | 42° |
| Film76 | 43° |
| Film77 | 44° |
| Film78 | 40° |

TABLE 5-continued

| No. | contact angle |
|---|---|
| Film79 | 53° |
| Film80 | 47° |
| Film81 | 66° |
| Film82 | 67° |
| Film83 | 64° |
| Film84 | 65° |
| Film85 | 68° |
| Film86 | 69° |
| Film87 | 65° |
| Film88 | 67° |
| Film89 | 55° |
| Film90 | 72° |
| Film91 | 70° |

TABLE 6

| No. | contact angle | No. | contact angle |
|---|---|---|---|
| unexposed PR-1 | 71° | exposed PR-1 | 53° |
| unexposed PR-2 | 73° | exposed PR-2 | 56° |

The silicon-containing films obtained from the silicon-containing compounds after exposure of the present invention had contact angles between 35° inclusive and 70° exclusive, respectively. The contact angles of the ArF resists after exposure were lowered to values between 50° and 60°, by about 20° as compared to those of the resist films before exposure, respectively.

Patterning Test

Formed on a silicon wafer was a spin-on carbon film ODL-50 (carbon content: 80 wt %) produced by Shin-Etsu Chemical Co., Ltd., at a film thickness of 200 nm. Coated thereon were the Solutions Sol.1 to Sol.91 of composition for forming silicon-containing film, followed by heating at 240° C. for 60 seconds, to produce silicon-containing films Film 1 to Film 91 each having a thickness of 35 nm, respectively.

Further coated thereon were ArF resist solutions listed in the following Table 7-1, followed by baking at 100° C. for 60 seconds, thereby forming photoresist layers each having a thickness of 100 nm, respectively. Moreover, on the photoresist layers, compositions of immersion top coat (TC-1) listed in the following Table 7-2 was coated, followed by baking at 90° C. for 60 seconds, thereby forming top coats each having a thickness of 50 nm, respectively.

Next, each photoresist layer was subjected to: exposure by an ArF immersion exposure apparatus (NSR-S610C; manufactured by Nikon Corp., NA: 1.30; a: 0.98/0.65; 35° dipole polarized illumination; and 6% halftone phase-shift mask); baking (PEB) at 100° C. for 60 seconds; ejection of butyl acetate as a developer from a development nozzle to the photoresist layer for 3 seconds while rotating it at 30 rpm; subsequent conduction of puddle development for 27 seconds, by stopping the rotation; spin-drying, after rinsing by diisoamyl ether; baking at 100° C. for 20 seconds, thereby evaporating the rinsing solvent.

Obtained by this patterning was a negative type of 43 nm line-and-space pattern at 1:1. This pattern was subjected to measurement of dimension by an electron microscope (S-9380) manufactured by Hitachi High-Technologies Corporation. The measurement results are shown in Table 8-1 to 8-4.

TABLE 7-1

| No. | Polymer (parts by mass) | Acid generator (parts by mass) | Base (parts by mass) | Solvent (parts by mass) |
|---|---|---|---|---|
| PR-1 | ArF resist polymer 1 (100) | PAG1 (7.0) | Quencher (1.0) | PGMEA (2,500) |
| PR-2 | ArF resist polymer 2 (100) | PAG1 (7.0) | Quencher (1.0) | PGMEA (2,500) |

ArF resist polymer 1:
Molecular weight (Mw) = 8,600
Distribution (Mw/Mn) = 1.88

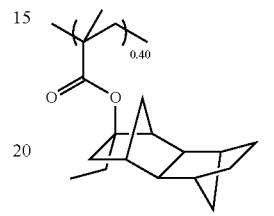

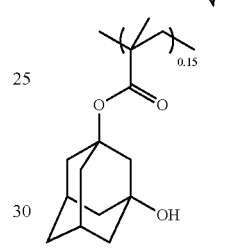

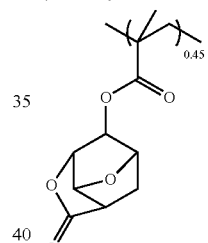

ArF resist polymer 2:
Molecular weight (Mw) = 8,900
Distribution (Mw/Mn) = 1.93

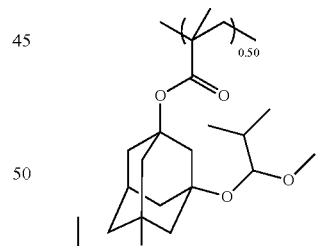

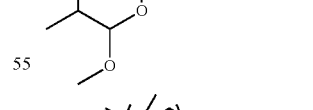

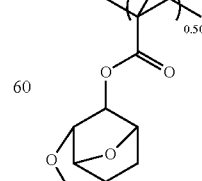

Acid generator: PAG1

TABLE 7-1-continued

| No. | Polymer (parts by mass) | Acid generator (parts by mass) | Base (parts by mass) | Solvent (parts by mass) |
|---|---|---|---|---|

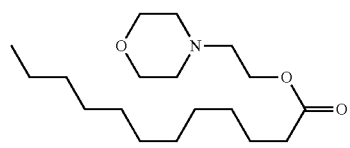 [SMILES: CCCCCCCCCCCC(=O)OCCN1CCOCC1]

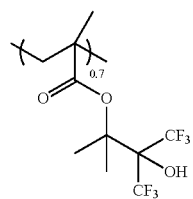

Base: Quencher

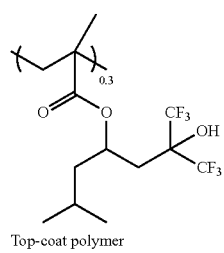

A resin composition was solved in organic solvent (each of them listed in Table 7-2), followed by filtration by a filter made of fluororesin of a 0.1 μm size, to prepare an immersion top coat (TC-1).

TABLE 7-2

| | Polymer (parts by mass) | Organic solvent (parts by mass) |
|---|---|---|
| TC-1 | Top-coat polymer (100) | Diisoamylether (2,700) 2-methyl-1-butanol (270) |

Top-coat polymer:
Molecular weight (Mw) = 8,800
Distribution (Mw/Mn) = 1.69

Top-coat polymer

TABLE 8-1

| | Silicon-containing film | ArF resist | Pattern profile of cross section after development | Pattern collapse |
|---|---|---|---|---|
| Example 1-1 | Film1 | PR-1 | vertical profile | free |
| Example 1-2 | Film2 | PR-1 | vertical profile | free |
| Example 1-3 | Film3 | PR-1 | vertical profile | free |
| Example 1-4 | Film4 | PR-1 | vertical profile | free |
| Example 1-5 | Film5 | PR-1 | vertical profile | free |
| Example 1-6 | Film6 | PR-1 | vertical profile | free |
| Example 1-7 | Film7 | PR-1 | vertical profile | free |
| Example 1-8 | Film8 | PR-1 | vertical profile | free |
| Example 1-9 | Film9 | PR-1 | vertical profile | free |
| Example 1-10 | Film10 | PR-1 | vertical profile | free |
| Example 1-11 | Film11 | PR-1 | vertical profile | free |
| Example 1-12 | Film12 | PR-1 | vertical profile | free |
| Example 1-13 | Film13 | PR-1 | vertical profile | free |
| Example 1-14 | Film14 | PR-1 | vertical profile | free |
| Example 1-15 | Film15 | PR-1 | vertical profile | free |
| Example 1-16 | Film16 | PR-1 | vertical profile | free |
| Example 1-17 | Film17 | PR-1 | vertical profile | free |
| Example 1-18 | Film18 | PR-1 | vertical profile | free |
| Example 1-19 | Film19 | PR-1 | vertical profile | free |
| Example 1-20 | Film20 | PR-1 | vertical profile | free |
| Example 1-21 | Film21 | PR-1 | vertical profile | free |
| Example 1-22 | Film22 | PR-1 | vertical profile | free |
| Example 1-23 | Film23 | PR-1 | vertical profile | free |

TABLE 8-2

| | Silicon-containing film | ArF resist | Pattern profile of cross section after development | Pattern collapse |
|---|---|---|---|---|
| Example 1-24 | Film24 | PR-1 | vertical profile | free |
| Example 1-25 | Film25 | PR-1 | vertical profile | free |
| Example 1-26 | Film26 | PR-1 | vertical profile | free |
| Example 1-27 | Film27 | PR-1 | vertical profile | free |
| Example 1-28 | Film28 | PR-1 | vertical profile | free |
| Example 1-29 | Film29 | PR-1 | vertical profile | free |
| Example 1-30 | Film30 | PR-1 | vertical profile | free |
| Example 1-31 | Film31 | PR-1 | vertical profile | free |
| Example 1-32 | Film32 | PR-1 | vertical profile | free |
| Example 1-33 | Film33 | PR-1 | vertical profile | free |

TABLE 8-2-continued

| | Silicon-containing film | ArF resist | Pattern profile of cross section after development | Pattern collapse |
|---|---|---|---|---|
| Example 1-34 | Film34 | PR-1 | vertical profile | free |
| Example 1-35 | Film35 | PR-1 | vertical profile | free |
| Example 1-36 | Film36 | PR-1 | vertical profile | free |
| Example 1-37 | Film37 | PR-1 | vertical profile | free |
| Example 1-38 | Film38 | PR-1 | vertical profile | free |
| Example 1-39 | Film39 | PR-1 | vertical profile | free |
| Example 1-40 | Film40 | PR-1 | vertical profile | free |
| Example 1-41 | Film41 | PR-1 | vertical profile | free |
| Example 1-42 | Film42 | PR-1 | vertical profile | free |
| Example 1-43 | Film43 | PR-1 | vertical profile | free |
| Example 1-44 | Film44 | PR-1 | vertical profile | free |
| Example 1-45 | Film45 | PR-1 | vertical profile | free |
| Example 1-46 | Film46 | PR-1 | vertical profile | free |

TABLE 8-3

| | Silicon-containing film | ArF resist | Pattern profile of cross section after development | Pattern collapse |
|---|---|---|---|---|
| Example 1-47 | Film47 | PR-1 | vertical profile | free |
| Example 1-48 | Film48 | PR-1 | vertical profile | free |
| Example 1-49 | Film49 | PR-1 | vertical profile | free |
| Example 1-50 | Film50 | PR-2 | vertical profile | free |
| Example 1-51 | Film51 | PR-2 | vertical profile | free |
| Example 1-52 | Film52 | PR-2 | vertical profile | free |
| Example 1-53 | Film53 | PR-2 | vertical profile | free |
| Example 1-54 | Film54 | PR-2 | vertical profile | free |
| Example 1-55 | Film55 | PR-2 | vertical profile | free |
| Example 1-56 | Film56 | PR-2 | vertical profile | free |
| Example 1-57 | Film57 | PR-2 | vertical profile | free |
| Example 1-58 | Film58 | PR-2 | vertical profile | free |
| Example 1-59 | Film59 | PR-2 | vertical profile | free |
| Example 1-60 | Film60 | PR-2 | vertical profile | free |
| Example 1-61 | Film61 | PR-2 | vertical profile | free |
| Example 1-62 | Film62 | PR-2 | vertical profile | free |
| Example 1-63 | Film63 | PR-2 | vertical profile | free |
| Example 1-64 | Film64 | PR-2 | vertical profile | free |
| Example 1-65 | Film65 | PR-2 | vertical profile | free |
| Example 1-66 | Film66 | PR-2 | vertical profile | free |
| Example 1-67 | Film67 | PR-2 | vertical profile | free |
| Example 1-68 | Film68 | PR-2 | vertical profile | free |
| Example 1-69 | Film69 | PR-2 | vertical profile | free |

TABLE 8-4

| | Silicon-containing film | ArF resist | Pattern profile of cross section after development | Pattern collapse |
|---|---|---|---|---|
| Example 1-70 | Film70 | PR-2 | vertical profile | free |
| Example 1-71 | Film71 | PR-2 | vertical profile | free |
| Example 1-72 | Film72 | PR-2 | vertical profile | free |
| Example 1-73 | Film73 | PR-2 | vertical profile | free |
| Example 1-74 | Film74 | PR-2 | vertical profile | free |
| Example 1-75 | Film75 | PR-2 | vertical profile | free |
| Example 1-76 | Film76 | PR-2 | vertical profile | free |
| Example 1-77 | Film77 | PR-2 | vertical profile | free |
| Example 1-78 | Film78 | PR-2 | vertical profile | free |
| Example 1-79 | Film79 | PR-2 | vertical profile | free |
| Example 1-80 | Film80 | PR-2 | vertical profile | free |
| Example 1-81 | Film81 | PR-2 | vertical profile | free |
| Example 1-82 | Film82 | PR-2 | vertical profile | free |
| Example 1-83 | Film83 | PR-2 | vertical profile | free |
| Example 1-84 | Film84 | PR-2 | vertical profile | free |
| Example 1-85 | Film85 | PR-2 | vertical profile | free |
| Example 1-86 | Film86 | PR-2 | vertical profile | free |
| Example 1-87 | Film87 | PR-2 | vertical profile | free |
| Example 1-88 | Film88 | PR-2 | vertical profile | free |
| Example 1-89 | Film89 | PR-2 | vertical profile | free |
| Comparative example 1-1 | Film90 | PR-1 | undercut profile | occurrence |
| Comparative example 1-2 | Film91 | PR-1 | negative profile | occurrence |

As exemplified in Table 8-1 to 8-4, it was possible to obtain a resist profile in a vertical profile, in each of Examples 1-1 to 1-89 using the silicon-containing films having contact angles between 35° inclusive and 70° exclusive, respectively. It was further recognized that the patterns were free of collapse.

On the contrary, in Comparative Examples 1-1 to 1-2 having contact angles of 70° or larger, respectively, resist profiles were each in an undercut profile or negative profile, with occurrence of pattern collapse.

Patterning Test: Developer

Instead of the developer (butyl acetate) noted in the above Examples 1, developers listed below were used in the same procedure as the Examples 1, thereby each obtaining a negative type of 43 nm line-and-space pattern at 1:1. The results are shown in Table 9.

TABLE 9

| | Silicon-containing film | ArF resist | Developer | Pattern profile of cross section after development | Pattern collapse |
|---|---|---|---|---|---|
| Example 2-1 | Film12 | PR-1 | 2-heptanone | vertical profile | free |
| Example 2-2 | Film12 | PR-1 | methyl benzoate | vertical profile | free |
| Example 2-3 | Film12 | PR-2 | ethyl benzoate | vertical profile | free |
| Example 2-4 | Film12 | PR-2 | phenyl acetate | vertical profile | free |
| Example 2-5 | Film18 | PR-1 | benzyl acetate | vertical profile | free |
| Example 2-6 | Film18 | PR-1 | methyl phenyl acetate | vertical profile | free |
| Example 2-7 | Film28 | PR-1 | 2-heptanone | vertical profile | free |
| Example 2-8 | Film28 | PR-1 | methyl benzoate | vertical profile | free |
| Example 2-9 | Film31 | PR-1 | ethyl benzoate | vertical profile | free |
| Example 2-10 | Film31 | PR-1 | phenyl acetate | vertical profile | free |
| Example 2-11 | Film47 | PR-1 | benzyl acetate | vertical profile | free |
| Example 2-12 | Film47 | PR-1 | methyl phenyl acetate | vertical profile | free |
| Example 2-13 | Film69 | PR-1 | benzyl acetate | vertical profile | free |
| Example 2-14 | Film69 | PR-1 | methyl phenyl acetate | vertical profile | free |
| Example 2-15 | Film76 | PR-1 | methyl benzoate | vertical profile | free |
| Example 2-16 | Film76 | PR-1 | ethyl benzoate | vertical profile | free |
| Example 2-17 | Film77 | PR-1 | phenyl acetate | vertical profile | free |
| Example 2-18 | Film77 | PR-1 | benzyl acetate | vertical profile | free |
| Example 2-19 | Film17 | PR-1 | methyl benzoate: butyl acetate = 6:4 | vertical profile | free |
| Example 2-20 | Film41 | PR-1 | methyl benzoate: 2-heptanone = 5:5 | vertical profile | free |
| Example 2-21 | Film44 | PR-1 | methyl benzoate: butyl acetate = 6:4 | vertical profile | free |
| Example 2-22 | Film61 | PR-1 | methyl benzoate: 2-heptanone = 5:5 | vertical profile | free |
| Example 2-23 | Film68 | PR-2 | methyl benzoate: butyl acetate = 6:4 | vertical profile | free |
| Example 2-24 | Film73 | PR-2 | methyl benzoate: 2-heptanone = 5:5 | vertical profile | free |

As shown in Table 9, it was possible to obtain resist patterns each having a profile in a vertical profile, even by using various developers.

Pattern Etching Test

Formed on a silicon wafer was a spin-on carbon film ODL-50 (carbon content: 80 wt %) produced by Shin-Etsu Chemical Co., Ltd., at a film thickness of 200 nm. Coated thereon were the Solutions Sol.11 to Sol.80, Sol.90, and Sol.91 of composition for forming silicon-containing film, followed by heating at 240° C. for 60 seconds, to produce silicon-containing films Film 1 to Film 80, Film 90, and Film 91 each having a thickness of 35 nm, respectively.

Further coated thereon were ArF resist solutions listed in the following Table 7, followed by baking at 100° C. for 60 seconds, thereby forming photoresist layers each having a thickness of 100 nm, respectively. Moreover, on the photoresist layers, immersion top coats (TC-1) listed in the Table 7-2 was coated, followed by baking at 90° C. for 60 seconds, thereby forming top coats each having a thickness of 50 nm, respectively. Next, each photoresist layer was subjected to: exposure by an ArF immersion exposure apparatus (NSR-S610C; manufactured by Nikon Corp., NA: 1.30; a: 0.98/0.65; 35° dipole polarized illumination; and 6% halftone phase-shift mask); baking (PEB) at 100° C. for 60 seconds; ejection of butyl acetate as a developer from a development nozzle to the photoresist layer for 3 seconds while rotating it at 30 rpm; subsequent conduction of puddle development for 27 seconds, by stopping the rotation; spin-drying, after rinsing by diisoamyl ether; baking at 100° C. for 20 seconds, thereby evaporating the rinsing solvent. Obtained by this patterning was a negative type of 43 nm line-and-space pattern at 1:1.

The silicon-containing film was dry etched by using a resist pattern as a mask under the following etching condition (1) followed by the following etching condition (2); thereby transferring the pattern to spin-on-carbon film. The cross-section form of the pattern was observed by an electron microscope (S-9380, manufactured by Hitachi, Ltd.) and pattern roughness after etching was observed by an electron microscope (CG4000, manufactured by Hitachi High-Technologies Corp.); and respective forms observed were compared and their results are shown in Table $10^{-1}$ to Table 10-3.

(1) Etching Condition by $CHF_3/CF_4$-Based Gas
Apparatus: Dry etching apparatus Telius SP manufactured by Tokyo Electron Limited
Etching condition (1):
  Chamber pressure: 10 Pa
  Upper/Lower RF power: 500 W/300 W
  $CHF_3$ gas flow rate: 50 ml/min
  $CF_4$ gas flow rate: 150 ml/min
  Ar gas flow rate: 100 ml/min
  Treating time: 40 sec (2) Etching condition by $O_2/N_2$-based gas
Apparatus: Dry etching apparatus Telius SP manufactured by Tokyo Electron Limited
Etching condition (2):
  Chamber pressure: 2 Pa
  Upper/Lower RF power: 1000 W/300 W
  $O_2$ gas flow rate: 300 ml/min
  $N_2$ gas flow rate: 100 ml/min
  Ar gas flow rate: 100 ml/min
  Treating time: 30 sec

TABLE 10-1

| | Silicon-containing film | ArF resist | Pattern profile of cross section of spin-on- carbon film after dry etching | Pattern roughness |
|---|---|---|---|---|
| Example 3-1 | Film11 | PR-1 | vertical profile | 1.7 nm |
| Example 3-2 | Film12 | PR-1 | vertical profile | 1.8 nm |
| Example 3-3 | Film13 | PR-1 | vertical profile | 1.8 nm |
| Example 3-4 | Film14 | PR-1 | vertical profile | 2.2 nm |

TABLE 10-1-continued

| | Silicon-containing film | ArF resist | Pattern profile of cross section of spin-on-carbon film after dry etching | Pattern roughness |
|---|---|---|---|---|
| Example 3-5 | Film15 | PR-1 | vertical profile | 1.7 nm |
| Example 3-6 | Film16 | PR-1 | vertical profile | 1.7 nm |
| Example 3-7 | Film17 | PR-1 | vertical profile | 1.5 nm |
| Example 3-8 | Film18 | PR-1 | vertical profile | 2.1 nm |
| Example 3-9 | Film19 | PR-1 | vertical profile | 1.5 nm |
| Example 3-10 | Film20 | PR-1 | vertical profile | 1.7 nm |
| Example 3-11 | Film21 | PR-1 | vertical profile | 1.7 nm |
| Example 3-12 | Film22 | PR-1 | vertical profile | 2.1 nm |
| Example 3-13 | Film23 | PR-1 | vertical profile | 1.7 nm |
| Example 3-14 | Film24 | PR-1 | vertical profile | 1.9 nm |
| Example 3-15 | Film25 | PR-1 | vertical profile | 1.9 nm |
| Example 3-16 | Film26 | PR-1 | vertical profile | 2.2 nm |
| Example 3-17 | Film27 | PR-1 | vertical profile | 1.6 nm |
| Example 3-18 | Film28 | PR-1 | vertical profile | 1.9 nm |
| Example 3-19 | Film29 | PR-1 | vertical profile | 1.6 nm |
| Example 3-20 | Film30 | PR-1 | vertical profile | 2.0 nm |
| Example 3-21 | Film31 | PR-1 | vertical profile | 2.0 nm |
| Example 3-22 | Film32 | PR-1 | vertical profile | 2.1 nm |
| Example 3-23 | Film33 | PR-1 | vertical profile | 2.0 nm |
| Example 3-24 | Film34 | PR-1 | vertical profile | 2.0 nm |

TABLE 10-2

| | Silicon-containing film | ArF resist | Pattern profile of cross section of spin-on-carbon film after dry etching | Pattern roughness |
|---|---|---|---|---|
| Example 3-25 | Film35 | PR-1 | vertical profile | 1.8 nm |
| Example 3-26 | Film36 | PR-1 | vertical profile | 1.6 nm |
| Example 3-27 | Film37 | PR-1 | vertical profile | 2.0 nm |
| Example 3-28 | Film38 | PR-1 | vertical profile | 2.0 nm |
| Example 3-29 | Film39 | PR-1 | vertical profile | 2.2 nm |
| Example 3-30 | Film40 | PR-1 | vertical profile | 1.7 nm |
| Example 3-31 | Film41 | PR-1 | vertical profile | 2.0 nm |
| Example 3-32 | Film42 | PR-1 | vertical profile | 1.7 nm |
| Example 3-33 | Film43 | PR-1 | vertical profile | 1.9 nm |
| Example 3-34 | Film44 | PR-1 | vertical profile | 1.7 nm |
| Example 3-35 | Film45 | PR-1 | vertical profile | 2.0 nm |
| Example 3-36 | Film46 | PR-2 | vertical profile | 1.8 nm |

TABLE 10-2-continued

| | Silicon-containing film | ArF resist | Pattern profile of cross section of spin-on-carbon film after dry etching | Pattern roughness |
|---|---|---|---|---|
| Example 3-37 | Film47 | PR-2 | vertical profile | 1.9 nm |
| Example 3-38 | Film48 | PR-2 | vertical profile | 1.8 nm |
| Example 3-39 | Film49 | PR-2 | vertical profile | 1.7 nm |
| Example 3-40 | Film50 | PR-2 | vertical profile | 1.8 nm |
| Example 3-41 | Film51 | PR-2 | vertical profile | 1.8 nm |
| Example 3-42 | Film52 | PR-2 | vertical profile | 1.8 nm |
| Example 3-43 | Film53 | PR-2 | vertical profile | 1.6 nm |
| Example 3-44 | Film54 | PR-2 | vertical profile | 2.2 nm |
| Example 3-45 | Film55 | PR-2 | vertical profile | 1.9 nm |
| Example 3-46 | Film56 | PR-2 | vertical profile | 1.6 nm |
| Example 3-47 | Film57 | PR-2 | vertical profile | 2.0 nm |
| Example 3-48 | Film58 | PR-2 | vertical profile | 1.7 nm |

TABLE 10-3

| | Silicon-containing film | ArF resist | Pattern profile of cross section of spin-on-carbon film after dry etching | Pattern roughness |
|---|---|---|---|---|
| Example 3-49 | Film59 | PR-2 | vertical profile | 1.8 nm |
| Example 3-50 | Film60 | PR-2 | vertical profile | 1.6 nm |
| Example 3-51 | Film61 | PR-2 | vertical profile | 2.0 nm |
| Example 3-52 | Film62 | PR-2 | vertical profile | 1.8 nm |
| Example 3-53 | Film63 | PR-2 | vertical profile | 1.8 nm |
| Example 3-54 | Film64 | PR-2 | vertical profile | 2.1 nm |
| Example 3-55 | Film65 | PR-2 | vertical profile | 1.7 nm |
| Example 3-56 | Film66 | PR-2 | vertical profile | 1.7 nm |
| Example 3-57 | Film67 | PR-2 | vertical profile | 2.1 nm |
| Example 3-58 | Film68 | PR-2 | vertical profile | 2.0 nm |
| Example 3-59 | Film69 | PR-2 | vertical profile | 2.2 nm |
| Example 3-60 | Film70 | PR-2 | vertical profile | 1.7 nm |
| Example 3-61 | Film71 | PR-2 | vertical profile | 1.7 nm |
| Example 3-62 | Film72 | PR-2 | vertical profile | 1.8 nm |
| Example 3-63 | Film73 | PR-2 | vertical profile | 1.8 nm |
| Example 3-64 | Film74 | PR-2 | vertical profile | 2.2 nm |
| Example 3-65 | Film75 | PR-2 | vertical profile | 1.7 nm |
| Example 3-66 | Film76 | PR-2 | vertical profile | 1.7 nm |
| Example 3-67 | Film77 | PR-2 | vertical profile | 1.5 nm |
| Example 3-68 | Film78 | PR-2 | vertical profile | 2.1 nm |

TABLE 10-3-continued

| | Silicon-containing film | ArF resist | Pattern profile of cross section of spin-on- carbon film after dry etching | Pattern roughness |
|---|---|---|---|---|
| Example 3-69 | Film79 | PR-2 | vertical profile | 1.5 nm |
| Example 3-70 | Film80 | PR-2 | vertical profile | 1.7 nm |
| Comparative example 3-1 | Film90 | PR-1 | pattern-wiggling profile | 4.5 nm |
| Comparative example 3-2 | Film91 | PR-1 | pattern-wiggling profile | 5.2 nm |

As shown in Table 10-1 to 10-3, it was recognized that the present invention was also excellent in resist profile after development, and pattern profile of cross section and pattern roughness of the spin-on carbon film after processing thereof.

On the contrary, in each of Comparative Examples, pattern wiggling was caused upon etching of the spin-on carbon film, resulting in considerably deteriorated pattern roughness of the spin-on carbon film after etching.

The present invention is not limited to the above embodiments. The above embodiments are merely illustrative, and whatever having the substantially same configurations as the technical concept recited in the appended claims of the present application and exhibiting the same functions and effects are embraced within the technical scope of the present invention.

What is claimed is:

1. A patterning process, comprising:
forming a silicon-containing film on a body to be processed by using a composition for the silicon-containing film;
forming, on the silicon-containing film, a photoresist film by using a chemical amplification resist composition;
heating the photoresist film;
after heating, exposing a high energy beam to the photoresist film; and
forming a negative pattern by dissolving an unexposed area of the photoresist film by using a developer of an organic solvent;
wherein
a portion of the silicon-containing film corresponding to the exposed area of the photoresist film has a pure-water contact angle in a range of 35 degrees to 70 degrees after the exposing; and
the composition for the silicon-containing film comprises a silicon-containing compound (A) having a repeating unit shown by the following general formula (A-1):

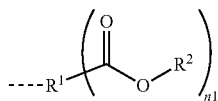

(A-1)

wherein
X represents an oxygen-containing functional group shown by any of the following general formulae (A-1-1), (A-1-2), and (A-1-3):

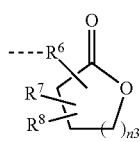

(A-1-1)

wherein
n1 represents 1 or 2;
$R^1$ represents a single bond or a linear, a branched, or a cyclic saturated or unsaturated hydrocarbon group having 1 to 20 carbon atoms;
$R^2$ represents a hydrogen atom, or a linear, a branched, or a cyclic saturated or unsaturated hydrocarbon group having 1 to 10 carbon atoms;
$R^1$ and $R^2$ may contain one or more selected from the group consisting of an oxygen atom, a silicon atom, and a halogen atom; and
the dotted line shows a bonding site to the silicon atom;

$$—R^3—(R^4—O—R^5)_{n2}$$ (A-1-2)

wherein
n2 represent 1 or 2;
each $R^3$ and $R^4$ independently represents a single bond, or a linear, a branched, or a cyclic saturated or unsaturated hydrocarbon group having 1 to 20 carbon atoms, though they do not represent a single bond simultaneously;
$R^5$ represents a hydrogen atom, or a linear, a branched, or a cyclic saturated or unsaturated hydrocarbon group having 1 to 10 carbon atoms, or an acyl group:
$R^3$, $R^4$, and $R^5$ may contain one or more selected from the group consisting of an oxygen atom, a silicon atom, and a halogen atom; and
the dotted line shows a bonding site to the silicon atom;

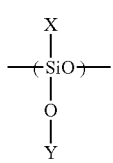

(A-1-3)

wherein
n3 represent 0, 1, or 2;
each $R^6$, $R^7$, and $R^8$ independently represents a saturated or unsaturated organic group having 1 to 20 carbon atoms and may contain any of an oxygen atom, a silicon atom, and a halogen atom, and may form a cyclic organic group by bonding any two or more of the $R^6$, $R^7$, and $R^8$; and
the dotted line shows a bonding site to the silicon atom; and Y represents a hydrogen atom, or any of an alkyl group, an alkoxy alkyl group, and a trialkyl silyl group, with the carbon atoms contained in the alkyl groups being 1 to 6, or a repeating unit shown by the following general formula (A-1-4) or (A-1-5):

(A-1-4)

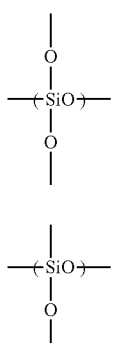

(A-1-5)

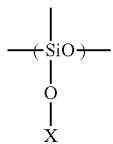

wherein X represents the same meaning as before.

2. The patterning process according to claim 1, wherein the composition for the silicon-containing film is a composition containing a silicon-containing compound (A') having the repeating unit shown by the general formula (A-1) that is changed to any of repeating units shown by the following general formulae (A-2), (A-3a), and (A-3b) by action of an acid generated by exposure in the photoresist film:

(A-2)

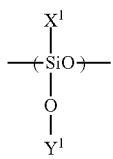

wherein
X¹ represents an oxygen-containing functional group shown by the following general formula (A-2-1) or (A-2-2):

(A-2-1)

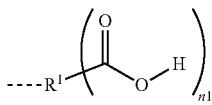

wherein n1 and R¹ represent the same meanings as before, while the dotted line therein shows the bonding site to the silicon atom:

—R³—(—R⁴—O—H)$_{n2}$          (A-1-2)

wherein n2, R³, and R⁴ represent the same meanings as before, while the dotted line therein shows the bonding site to the silicon atom; and Y¹ represents a hydrogen atom, or any of an alkyl group, an alkoxy alkyl group, and a trialkyl silyl group, with the carbon atoms contained in these alkyl groups being 1 to 6, or a repeating unit shown by the general formula (A-1-4) or (A-1-5), or by the following general formula (A-2-3):

(A-2-3)

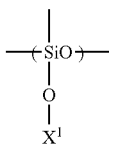

wherein X¹ represents the same meaning as before;

(A-3a)

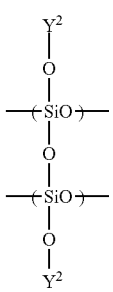

(A-3b)

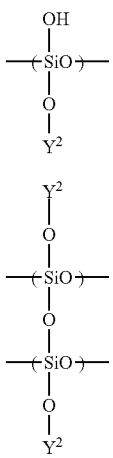

wherein Y² represents a hydrogen atom, or any of an alkyl group, an alkoxy alkyl group, and a trialkyl silyl group, with the carbon atoms contained in these alkyl groups being 1 to 6, or a repeating unit shown by the general formula (A-1-4), (A-1-5), or (A-2-3), or by the following general formula (A-3a-1) or (A 3b-1):

(A-3a-1)

(A-3b-1)

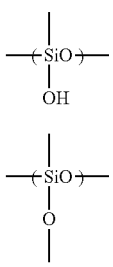

3. The patterning process according to claim 2, wherein the portion of the silicon-containing film corresponding to the exposed area of the photoresist film has a lower pure-water contact angle after the exposing than before the exposing.

4. The patterning process according to claim 3, wherein the patterning process of the photoresist film is effected by any of a photolithography with a wavelength ranging from 10 nm to 300 nm; a direct drawing by an electron beam; a nanoprinting; or a combination thereof.

5. The patterning process according to claim 4, wherein the developer contains, as a developer component, one or more solvents selected from the group consisting of 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl pentanoate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

6. The patterning process according to claim 5, wherein one or more developer components constitute at least 50 mass % of the developer.

7. The patterning process according to claim 6, further comprising:
 before forming the silicon-containing film, forming an organic underlayer film or an organic hard mask on the body to be processed;
 wherein the silicon-containing film is formed on the organic underlayer film or on the organic hard mask.

8. The patterning process according to claim 7, further comprising:
 dry etching the silicon-containing film using the negative pattern of the photoresist film;
 dry etching the organic underlayer film or the organic hard mask using the dry-etched silicon-containing film as a mask; and
 dry etching the body to be processed using the dry-etched organic underlayer film or the dry-etched organic hard mask as a mask.

9. The patterning process according to claim 8, wherein the body to be processed is a semiconductor substrate having any of a metal film, a metal carbide film, a metal oxide film, a metal nitride film, and a metal oxy nitride film formed thereon.

10. The patterning process according to claim 9, wherein the body to be processed comprises any of silicon, titanium, tungsten, hafnium, zirconium, chromium, germanium, copper, aluminum, and iron, or an alloy thereof.

11. The patterning process according to claim 1, wherein the patterning process of the photoresist film is effected by any of a photolithography with a wavelength ranging from 10 nm to 300 nm; a direct drawing by an electron beam; a nanoprinting; or a combination thereof.

12. The patterning process according to claim 1, wherein the developer contains, as a developer component, one or more solvents selected from the group consisting of 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl pentanoate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

13. The patterning process according to claim 7, wherein the one or more developer components constitute at least 50 mass % of the developer.

14. The patterning process according to claim 1, further comprising:
 before forming the silicon-containing film, forming an organic underlayer film or an organic hard mask on the body to be processed;
 wherein the silicon-containing film is formed on the organic underlayer film or on the organic hard mask.

15. The patterning process according to claim 14, further comprising:
 dry etching the silicon-containing film using the negative pattern of the photoresist film;
 dry etching the organic underlayer film or the organic hard mask using the dry-etched silicon-containing film as a mask; and
 dry etching the body to be processed using the dry-etched organic underlayer film or the dry-etched organic hard mask as a mask.

16. The patterning process according to claim 1, wherein the body to be processed is a semiconductor substrate having any of a metal film, a metal carbide film, a metal oxide film, a metal nitride film, and a metal oxy nitride film formed thereon.

17. The patterning process according to claim 16, wherein the body to be processed comprises any of silicon, titanium, tungsten, hafnium, zirconium, chromium, germanium, copper, aluminum, and iron, or an alloy thereof.

* * * * *